(12) United States Patent
Erb

(10) Patent No.: US 8,379,754 B2
(45) Date of Patent: Feb. 19, 2013

(54) METHOD AND DEVICE FOR PREDICTING A FIGURE OF MERIT FROM A DISTRIBUTION

(75) Inventor: Stefan Erb, Meran (IT)

(73) Assignee: Infineon Technologies AG, Neubiberg (DE)

( * ) Notice: Subject to any disclaimer, the term of this patent is extended or adjusted under 35 U.S.C. 154(b) by 995 days.

(21) Appl. No.: 12/415,449

(22) Filed: Mar. 31, 2009

(65) Prior Publication Data

US 2010/0246650 A1 Sep. 30, 2010

(51) Int. Cl.
*H04L 27/10* (2006.01)
(52) U.S. Cl. ...................................................... 375/284
(58) Field of Classification Search ................. 375/284, 375/224; 72/67, 180, 181, 69; 702/67, 180, 702/181, 69
See application file for complete search history.

(56) References Cited

U.S. PATENT DOCUMENTS

| | | | |
|---|---|---|---|
| 6,298,315 B1 * | 10/2001 | Li et al. | 702/180 |
| 6,931,335 B2 | 8/2005 | Mueller | |
| 7,016,805 B2 | 3/2006 | Sun et al. | |
| 7,149,638 B2 | 12/2006 | Stephens | |
| 7,191,080 B2 | 3/2007 | Stephens | |
| 7,246,274 B2 | 7/2007 | Kizer et al. | |
| 2003/0115017 A1 * | 6/2003 | Sun et al. | 702/181 |
| 2003/0191592 A1 * | 10/2003 | Mueller | 702/69 |
| 2006/0059392 A1 * | 3/2006 | Kizer et al. | 714/704 |
| 2007/0136012 A1 * | 6/2007 | Miller | 702/67 |

OTHER PUBLICATIONS

Li, M.P., et al., "A new method for jitter decomposition through its distribution tail fitting," International Test Conference, 1999, Sep. 28-30, 1999, pp. 788-794, IEEE.
Da Dalt, N., et al., "Numerical modeling of PLL jitter and the impact of its non-white spectrum on the SNR of sampled signals," 2001 Southwest Symposium on Mixed-Signal Design, Feb. 25-27, 2001, pp. 38-44, IEEE.
Ham, B., et al., "Fibre Channel—Methodologies for jitter and signal quality specification—MJSQ," Technical report, Jun. 9, 2004, T11. 2/Project 1316-DT/Rev 14, 259 pages, INCITS.
Ou, N., et al., "Jitter models for the design and test of Gbps-speed serial interconnects," IEEE Design and Test of Computers, Jul.-Aug. 2004, vol. 21, No. 4, pp. 302-313, IEEE.
"Physical layer performance: Testing the bit error ratio (ber)," Technical Article HFTA-010.0, Sep. 2004, 7 pages, Maxim.
"Jitter analysis: The dual-Dirac Model, RJ/DJ, and Q-Scale", White Paper, Dec. 31, 2004, pp. 1-16, Agilent Technologies, Inc.
McClure Jr., M. S., "Digital jitter measurement and separation", Master's thesis, Texas Tech University, Aug. 2005, 120 pages.
Bizjak, L., "Development of a PLL blocks library for accurate time-domain simulations and clock analysis software," Master's thesis, Universita Degli Studi di Udine, 2005, 153 pages.
Mueller, M., et al., "Total jitter measurement at low probability levels, using optimized BERT scan method,"White Paper, DesignCon 2005, pp. 1-18, Agilent Technologies, Inc.
Hong, D., et al., "Bit-Error-Rate Estimation for High-Speed Serial Links," IEEE Transactions on Circuits and Systems I: Regular Papers, Dec. 2006, vol. 53, No. 12, pp. 2616-2627, IEEE.
Hong, D., et al., "An accurate jitter estimation technique for effcient high speed i/o testing," 16th Asian Test Symposium, 2007, Oct. 8-11, 2007, pp. 224-229, IEEE.

(Continued)

*Primary Examiner* — Jaison Joseph
(74) *Attorney, Agent, or Firm* — Slater & Matsil, L.L.P.

(57) ABSTRACT

Embodiments of the invention relate to methods and devices for predicting a figure of merit from a distribution at least including scalably normalizing the distribution to approximate a predetermined part of the normalized distribution.

16 Claims, 19 Drawing Sheets

OTHER PUBLICATIONS

Hong, D. et al., "Bit-error rate estimation for bang-bang clock and data recovery circuit in high-speed serial links," 26th, IEEE VLSI Test Symposium, Apr. 27-May 1, 2008, pp. 17-22, IEEE.

Dou, Q., et al., "Jitter decomposition in high-speed communication systems," 13th European Test Symposium, 2008, May 25-29, 2008, pp. 157-162, IEEE.

* cited by examiner

METHOD AND DEVICE FOR PREDICTING A FIGURE OF MERIT FROM A DISTRIBUTION

TECHNICAL FIELD

Embodiments of the present invention relate to methods and devices for predicting a figure of merit from a distribution such as a bit error rate (BER) from a jitter distribution. Other embodiments of the invention relate to methods and devices for the optimization of the analysis of distributions.

SUMMARY OF THE INVENTION

A device and/or methods for predicting a figure of merit from a distribution and/or for extracting deterministic and random components from a distribution is provided, substantially as shown in and/or described in connection with at least one of the figures, as set forth more completely in the claims.

Further features and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated as they become better understood by reference to the following detailed description.

FIG. 9b shows Q-normalized functions of the cumulative density functions (CDF) of the different jitter distribution types according to FIG. 9a;

DETAILED DESCRIPTION OF ILLUSTRATIVE EMBODIMENTS

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

In the following, for illustration purposes, embodiments of the invention will be described with reference to a method for predicting a bit error rate from a measured jitter distribution, which may, e.g., be implemented within communication measurement instruments such as sampling scopes or Bit Error Rate Test scopes, or short BERT-scopes. However, the invention is not so limited and may find its application in conjunction with any other type of distribution from which a figure of merit shall be derived from the distribution in a fast and efficient way by approximating certain parts of the distribution.

Typically, methods and devices according to embodiments of the invention may help to provide significant reduction of (measurement) time to collect or determine data samples for the construction of distributions since less such data samples may be needed. Furthermore, the embodiments may easily be implemented in a digital signal processor (DSP) architecture.

The BER in high-speed serial links may conventionally only be estimated via intense statistical analysis of collected data samples. Input signal changes also referred to as bit transitions mark time instants where the voltage controlled oscillator (VCO) clock of the receiver phase-locked loop (PLL) may be related to the clock signal (clock transitions) of transmitted data. The difference between both time instances marked by the above transitions may be a measure for timing displacement, also referred to as jitter or uncertainty of timing.

In the literature (e.g., L. Bizjak, "Development of a PLL blocks library for accurate time-domain simulations and clock analysis software", Master's thesis, Università degli studi di Udine, 2005, and N. Da Dalt, "Numerical modeling of PLL jitter and the impact of its non-white spectrum on the SNR of sampled signals", Southwest Symposium on Mixed-Signal Design, February 2001), different definitions of jitter have been given. Jitter may e.g. be caused by i) a transmitter PLL, ii) inter symbol interference (ISI) and/or noise along the transmission path, and/or iii) receiver PLL inherent phase noise of the receiver structure. Jitter is the major cause to erroneous data recovery and hence, there have been a lot of strives to quantify and describe it accurately.

Figure 1:
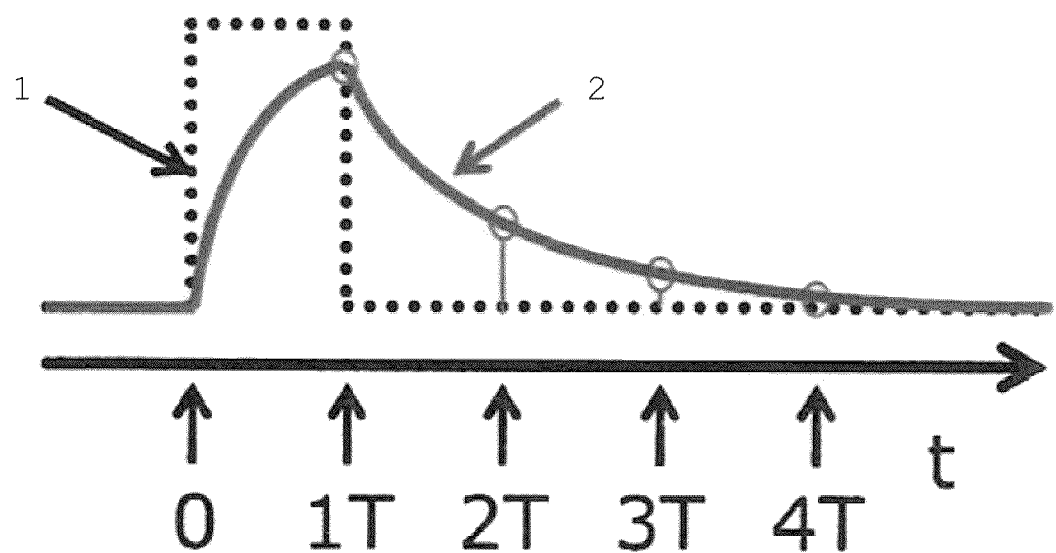
FIG. 1 shows a typical channel impulse response demonstrating signal degradation and jitter due to ISI.

In FIG. 1, a channel's impulse response is given, demonstrating signal degradation and jitter caused by ISI. FIG. 1 symbolizes how a transmitter pulse 1 travels through the channel and spreads in time, causing deterministic jitter in the zero crossings of the received signal 2. For instance, in an example of a 6 Gb/s S-ATA channel, as many as 5-8 post-cursor and 1-2 pre-cursor samples may appear, where only the post-cursors may typically be compensated with, e.g., decision feedback equalization (DFE) techniques.

Crosstalk may also be an important contributor for signal distortions, originating from interactions of electromagnetic (EM) fields between adjacent physical data channels. Crosstalk may lead to distortions in both voltage and time domain.

All jitter sources together typically lead to erroneous timing recovery, and hence, misinterpretation of received data as soon as a critical jitter amplitude is reached.

Figure 2:
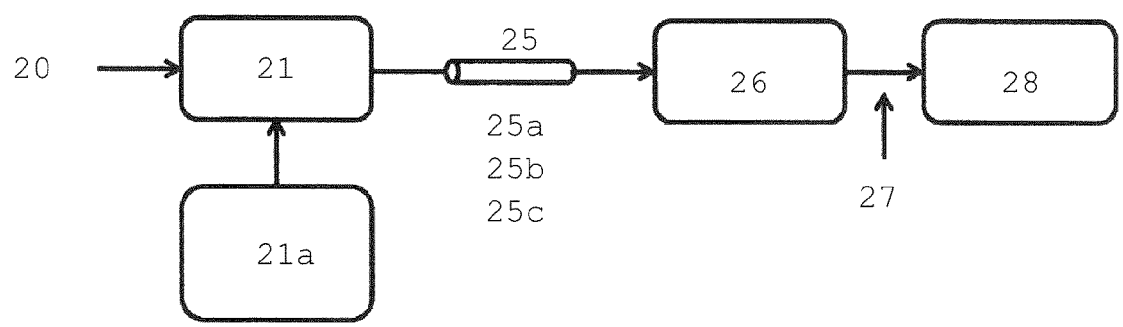
FIG. 2 shows typical jitter sources in a high-speed transceiver system.

FIG. 2 summarizes typical jitter sources in a high-speed transceiver system: namely a jittery clock 21 at the transmitter side 21 causing jitter to the clean data 20, as well as ISI 25a, reflection 25b and crosstalk 25c as typical jitter sources of the transmission channel 25, and the accumulated jitter 27 after an equalizer 26 at the receiver side. The clock and data recovery (CDR) 28 at the receiver side may compensate for some of the accumulated jitter. However, the phase noise inherent to the receiver PLL as part of the CDR 28 and of the receiver structure may also be the source of additional jitter.

The bit error rate BER directly reflects the probability of jitter samples reaching a predetermined threshold, and thus, may be one of the best suited figures of merit to indicate the quality of a digital communication system. In fact, it would be desirable to describe a relation between BER and measured jitter to thoroughly investigate the influence of jitter on transmitted data and to provide an identification of possible root causes.

In this context, eye diagrams show the problem associated with data recovery. Eye diagrams show the transient digital data signal when folded in time domain to a single bit period $T_B$ and normalized to a unit interval (UI) as symbolized by the schematic eye diagram 35 in the lower half of FIG. 3. The untreated "received eye" formed by the received signal is often almost closed and has to be reopened with equalization techniques or signaling schemes that try to compensate the channel influence. Unfortunately, the eye diagram is not quite suited to determine a figure of merit for estimating the BER.

Moreover, the measurement of a target BER of $10^{-12}$ may be very time consuming depending on the data rate. Often it takes hours or even days to measure the so called bathtub curve which relates the BER to the jitter amplitude. The literature (Maxim Inc., "Physical layer performance: Testing the bit error ratio (ber)", Maxim Technical Article, 2004, and "Total jitter measurement at low probability levels, using optimized BERT scan methods", White Paper, Agilent Tech., 2005) has examined the trade-off of measurement time versus BER confidence level and derive the following equation for the required number of bits to ensure a desired target BER:

$$N = \frac{1}{R}\left[-\ln(1-CL) + \ln\left(\sum_{k=0}^{E} \frac{(N \times R)^k}{k!}\right)\right] \quad (1)$$

where $R=10e^{-12}$ is the required BER level, CL the probability or confidence level that the true BER is less than R and E the number of detected errors during measurement. When no errors are detected (i.e., E=0), the second term of Equation 1 becomes zero and the solution to this equation is greatly simplified.

For example, for a confidence level of CL=95%, one has to transmit $3.00/R=3\cdot 10^{12}$ bits without errors in order to meet the specification requirements. In a 3 Gb/s transceiver system this would require an analysis time of T=N/R=1000 s=16 m, 40 s.

Further, if the unit interval is divided into multiple equally sized steps in order to construct the complete bathtub curve, measurement times of several hours may easily be reached.

The bathtub curve is a common way for representing the BER in terms of the sampling time instant, obtained from the cumulative density function CDF or integral of a measured jitter distribution. The CDF representation may be modified by a logarithmic scale and by being centered around the optimum sampling or decision time instant as shown in FIG. 4, which finally leads to the bathtub curve.

One goal is to design a sampling system in a way such that both edges of the bathtub curve keep sufficiently separated down to a required BER level. For high-speed communication systems, this target level is usually chosen according to the specification requirements, e.g., to be $BER_{spec}=10^{-12}$. The required eye opening at this level is given by the distance between the corresponding points on the left and right BER partial curves at $BER_{spec}$ and expressed in Equation 2 as:

$$t_{eye} = T_B - t_L - t_R \quad (2)$$

where $T_B$ represents the bit period, and $t_L$ and $t_R$ the resulting time values at $BER_{spec}=10^{-12}$ on the bathtub curve. The total jitter TJ may thus directly be determined in Equation 3 as:

$$TJ = T_B - t_{eye} = t_L + t_R \quad (3)$$

If normalized to the unit interval (UI), i.e., $T_B$ is set as $T_B=1$, $t_L$ and $t_R$ equal the portions of eye closure. In other words, $t_L$ and $t_R$ designate time interval portions of the unit interval which are not available for sampling in case $BER_{spec}$ has to be fulfilled by the designed system.

In high-speed transceiver applications, jitter amplitude histograms may be collected for estimation and analysis of erroneous data sampling and recovery. The goal is to quantify and predict jitter influence and BER in clock recovery circuits. Since jitter is the major limiting factor of today's high-speed serial interfaces and the bit error rate is the best suited figure of merit to indicate the quality of a digital communication system, the description of a relation between these measures is desired.

Basically following the dual-Dirac model, a key issue has been to describe a measured jitter distribution in terms of a bounded deterministic jitter component DJ and an unbounded random jitter component RJ which are commonly assumed to follow a Gaussian distribution with mean $\mu$, variance $\sigma$ and amplitude $A_{max}$ on the left and right side of the distribution tails. See "Jitter analysis: The dual-dirac model, rj/dj, and q-scale", White Paper, Agilent Tech., December 2004. Together they form the measured total jitter TJ with unbounded tails extending toward a specific BER level of interest. The composition of the total jitter TJ in terms of the bounded deterministic jitter component DJ and the unbounded random jitter component RJ may be described by Equation 4:

$$TJ_{pp} = DJ_{pp} + RJ_{pp} = DJ_{pp} + 14.069 \cdot RJ_{rms} \quad (4)$$

where $TJ_{pp}$ denotes the peak-to-peak value of the total jitter TJ, and the multiplicative factor for the variance of the random jitter $RJ_{rms}$ is derived by converting $BER_{spec}$ into units of Gaussian variance. "Jitter analysis: The dual-dirac model, rj/dj, and q-scale", White Paper, Agilent Tech., December 2004. As expressed before, when related to the unit interval UI, the obtained total jitter is the portion not available for sampling, if the system performance must be better than $BER_{spec}$.

Thus, once the values of the deterministic jitter component $DJ_{pp}$ and of the random jitter component $RJ_{rms}$ have been extracted from the measured distribution, a simple timing budget for total jitter may be obtained with Equation 4. Like the methods according to embodiments of the present invention, various other methods have already tried to estimate these parameters from a given distribution, and thus, for a better understanding of the background of the present invention, these previous methods are explained in the following.

As already stated, the major problem for determining error rates at very low probability level is the excessive amount of data samples needed to obtain accurate results. In simulation applications, the BER curves may typically only be tracked down to BER levels of $10^{-8}$ or $10^{-9}$. For probability levels of $10^{-12}$ and lower, direct BER estimation from the histogram tail part is not feasible and hence, an extrapolation of the bathtub curve from a higher probability level may be performed.

In order to overcome this problem, a variety of extrapolation techniques have been developed for the analysis of the total jitter TJ and BER estimation. "Jitter analysis: The dual-dirac model, rj/dj, and q-scale", White Paper, Agilent Tech., December 2004; Mike P. Li, Jan Wilstrup, Ross Jenssen, Dennis Petrich, "A new method for jitter decomposition through its distribution tail fitting", IEEE International Test Conference, 1999; and Hong and Cheng, "An accurate jitter estimation technique for efficient high speed i/o testing", IEEE Asian Test Symposium, 2007.

Today, several estimation techniques are known which extract random jitter RJ and deterministic jitter DJ components out of the measured distribution tails. More specifically, different approaches have tried to separate the random and deterministic jitter parts with distribution tail fitting and extrapolation algorithms. Most of them rely on the analysis of the jitter histogram.

Figure 3:
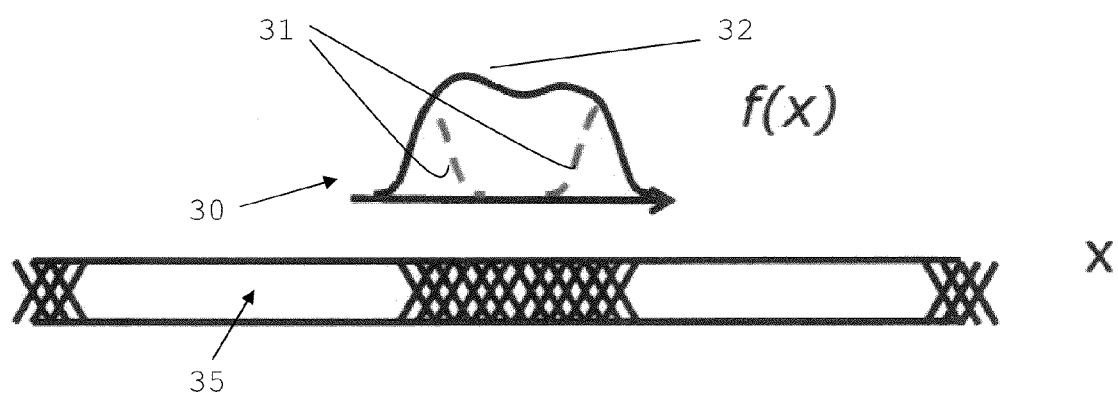
FIG. 3 shows random jitter (RJ) and deterministic jitter (DJ) components of a jitter probability density function (PDF)

The dual-Dirac model as already mentioned above is based on a Gaussian approximation of the outer edges of the jitter distribution displaced by $DJ_{pp} \equiv |\mu_L - \mu_R|$. "Jitter analysis: The dual-dirac model, rj/dj, and q-scale", White Paper, Agilent Tech., December 2004. As shown in FIG. 3, the model assumes that the total jitter TJ corresponding to the probability density function (PDF) of the total jitter distribution 30 can always be decomposed into two Gaussian distribution functions RJ forming the tails of the PDF or histogram and an arbitrary bounded deterministic jitter distribution function DJ. In other words, the distribution functions RJ represent the random jitter component 31 and the distribution functions DJ represent the deterministic jitter component 32.

The dual-Dirac model assumptions can be summarized as follows:

1. The measured jitter distribution can be separated into two categories, a random distribution function RJ and a deterministic distribution function DJ.
2. RJ follows an unbounded Gaussian distribution and can be fully described by its mean, variance and amplitude value.
3. DJ follows a finite, bounded distribution.
4. Jitter is a stationary random process.

The tail fitting algorithm is also based on the dual-Dirac model assumption and has been described in the literature. Hong et al., "Bit-error-rate estimation for high-speed serial links," IEEE Transactions on Circuits and Systems, 53(12): 2616-2627, 2006; Li et al., "A new method for jitter decomposition through its distribution tail fitting," IEEE International Test Conference, 1999; and Scott McClure, "Digital jitter measurement and separation," Master's thesis, Texas Tech University, Lubbock, Tex., 2006. It is a widely used approach that fits a parameterized Gaussian model to the tails of a distribution. More specifically, a simple Gaussian comparison function is parameterized and used to fit the tails of the jitter distribution.

A chi-squared test minimizes the difference between measured data and model prediction, and iteratively searches the Gaussian parameters mean $\mu$, variance $\sigma$ and amplitude $A_{max}$. Initial estimates for the number of samples belonging to the Gaussian tail parts are obtained in a conservative way via first and second order derivatives of the smoothed jitter histogram. Although widely applied, the algorithm suffers from high complexity due to the multi-dimensional optimization.

Jitter estimation based on the correlation technique considers the evolution of jitter samples in time. Dou et al., "Jitter decomposition in high-speed communication systems", IEEE European Test Symposium, pages 157-162, 2008. With the autocorrelation function, extraction of different DJ types, such as duty cycle distortion (DCD), sinusoidal (PJ) and even data dependent jitter (DDJ) becomes possible. With only a few thousand samples, estimates can already be obtained with an acceptable accuracy. Decomposition of DJ into these distribution types provides an identification of the different root causes of jitter: Data Dependent Jitter (DDJ) caused by ISI and crosstalk; Duty Cycle Distortion (DCD) describes wave phase modulation effects, and Sinusoidal Jitter (SJ) is applied for jitter tolerance measurements. Bill Ham, "Methodologies for jitter and signal quality specification", Technical report, INCITS, June 2005.

Unlike in histogram based methods, the approach is still missing a relation between extracted deterministic jitter DJ components and the total jitter, which impedes derivation of the BER.

Instead of the dual-Dirac model assumption, this technique monitors the amount of errors captured over a certain number N of transmitted bits.

In this technique, a possible way of reducing test times involves intentional reduction of the SNR of the system by a known quantity during testing. Maxim Inc., "Physical layer performance: Testing the bit error ratio (ber)," Maxim Technical Article, 2004. This results in more bit errors and a quicker measurement of the resulting degraded BER. If the relationship between SNR and BER is known, the BER results can be extrapolated to estimate the BER of interest. Implementation of this method is based on the restriction that Gaussian noise at the input to the receiver is the dominant cause of bit errors in the system.

The relationship between SNR and BER can be derived from Gaussian statistics and is documented in many communications text books. See, e.g., Simon Haykin, "Communication Systems", John Wiley & Sons, 2001. The described approach is only applicable for random jitter RJ dominant cases, and the high amount of necessary test samples is not practicable for simulation applications. Also, a disadvantage of this technique is a reduction in confidence level which becomes more significant as the extrapolation distance becomes larger.

Figure 4A:
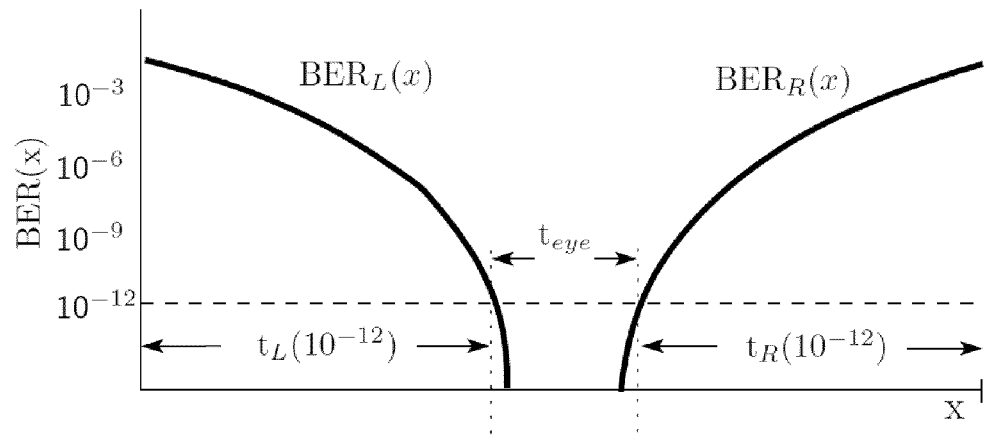
FIG. 4a shows a diagram of the dependence of BER (bit error rate) on sampling instant within a bit period $T_B$ in the form of a typical bathtub curve.

Another conventional method is based on the analysis of jitter distributions. The Q-normalization technique known from the literature linearizes and extrapolates Gaussian tail parts as shown in FIG. 4a in the bathtub curve using the so called Q-function. "Jitter analysis: The dual-dirac model, rj/dj, and q-scale", White Paper, Agilent Tech., December 2004 and Hong and Cheng, "An accurate jitter estimation technique for efficient high speed i/o testing", IEEE Asian Test Symposium, 2007.

Figure 4B:
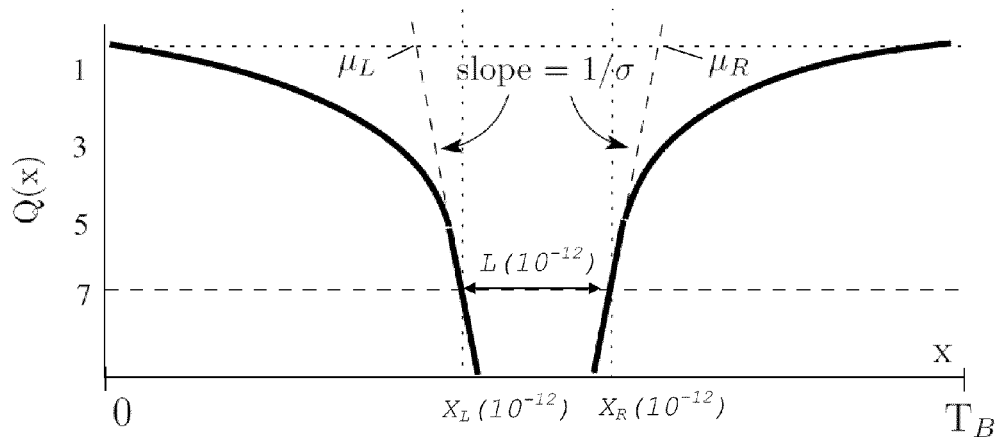
FIG. 4b shows a Q-normalized bathtub curve.

As a result, the Q-normalization technique may obtain a modified bathtub curve as shown in FIG. 4b with the tails asymptotically approaching a straight line. Linear regression analysis allows for estimation of the Gaussian parameters from the approximated straight line and may achieve accurate results if the fit is applied in a sufficiently low probability region.

The linear extrapolation at the tail endings is carried out until the BER of interest, where the desired timing budget for the total jitter TJ can be determined. The necessary extrapolation may be huge, ranging over several orders of magnitude. Hong and Cheng, "An accurate jitter estimation technique for efficient high speed i/o testing", IEEE Asian Test Symposium, 2007.

When comparing Q-normalization technique and the tail fitting algorithm, the first one tends to be more repeatable because it is less affected by random data fluctuation.

The major drawback of the conventional Q-normalization technique is that estimation accuracy is extremely sensitive to the fitting region. If not only the Gaussian part of the tail is considered, the resulting estimate for the total jitter TJ will be highly misleading. Consequently, the fit should be performed only on the tail parts of the distribution that truly follow the underlying Gaussian RJ distribution function. However, it is difficult to determine where the corresponding asymptotic behavior begins.

Whether or not the fit is applied low enough on the slopes depends on the statistical significance of the measurement. That is, the more data acquired, the farther down the slopes one can fit. By repeating the fit for a successively larger number of statistical samples, the deterministic jitter component value $DJ_{pp}$ as well as the slopes on the left and right edges should converge to a constant value. Due to the overestimating property of the Q-normalization, the fitting technique at least always leads to pessimistic total jitter TJ and BER estimates.

As the methods according to embodiments of the invention are also based on the Q-normalization technique, its underlying mathematics will be explained later on.

Hong, et al. improved the Q-normalization technique by fitting higher order polynomials to the Q-normalized bathtub curve and achieved an estimation accuracy <1% in a BER region of $10^{-4} \ldots 10^{-6}$. Hong and Cheng, "An accurate jitter estimation technique for efficient high speed i/o testing", IEEE Asian Test Symposium, 2007. However, estimation accuracy highly depends on the underlying deterministic jitter DJ distribution. Also the influence of random data fluctuation has not been considered, since exact bathtub curves out of closed form equations were utilized.

A novel jitter estimation and decomposition method for accurate histogram based analysis has been developed. The method investigates a measured distribution with respect to Gaussian tail behavior and separates it into random and deterministic components. With the novel method these components are determined very efficiently, allowing the technique to be utilized in a variety of applications, such as jitter measurement devices (e.g., BERT-scope), production testing (I/O testing) and simulators.

The presented BER estimation approach is also based on the dual-Dirac model assumptions. As will be demonstrated in the following it clearly outperforms existing techniques and presents a very accurate and efficient method for jitter decomposition and BER estimation.

The proposed method also utilizes the Q-normalization and its linearization property but overcomes the problems mentioned at the beginning by scaling the input data prior to transformation into the Q-domain. In the context of an optimization procedure this yields very accurate estimates.

As mentioned before, the underlying mathematics of the Q-normalization technique will be explained in the following.

The bathtub curve describes the BER as a function of the jitter amplitude x. If the bathtub curve is normalized to Q, or units of Gaussian variance σ, the distribution tails will appear as straight lines if these are Gaussian. This normalization is very useful in the context of the bathtub curve, as it allows for a linear tail extrapolation.

Therefore, the Q-function is briefly derived together with the equations required for the optimization method according to an embodiment of the present invention. If the samples of a pure Gaussian distribution are given, the bit error rate BER (x) may be determined by Equation 5:

$$BER(x) = \sigma_T \frac{1}{\sqrt{2\pi}\sigma} \int_x^\infty e^{-\left[\frac{(\mu-x')^2}{2\sigma^2}\right]} dx' \qquad (5)$$

where μ is the mean value and u the standard deviation of the Gaussian distribution. The parameter $\sigma_T$ is the transition density and reflects the probability of bit transitions in the transmitted data. In a clock-like '1010···' pattern, for example, $\sigma_T$ equals 1, while for pseudo random bit sequence (PRBS) data, $\sigma_T$ equals 0.5. When normalizing Equation 5 with $Q=(\mu-x)\sigma$, one gets:

$$BER(Q) = \sigma_T \frac{1}{\sqrt{2\pi}} \int_Q^\infty e^{-\left(\frac{Q'^2}{2}\right)} dQ'. \qquad (6)$$

Since the complementary error function is given as:

$$\mathrm{erfc}(x) = \frac{2}{\sqrt{\pi}} \int_x^\infty e^{-x'^2} dx'. \quad (7)$$

Equation 6 may be simplified to:

$$BER(Q) = \frac{\sigma_T}{2} \mathrm{erfc}\left(\frac{Q}{\sqrt{2}}\right). \quad (8)$$

This result may now be inverted and yields Q(BER). By substituting with BER(x), the Q-function may be further generalized to the arbitrary case without restriction on a Gaussian distribution. Hence, the Q-normalization is obtained as:

$$Q(x) = \sqrt{2} \cdot \mathrm{erfc}^{-1}\left(\frac{2 \cdot BER(x)}{\sigma_T}\right). \quad (9)$$

An example for the Q-normalized bathtub curve has already been given in FIG. 4b. A regression line can be fitted to the Q-function and utilized for extrapolation as in See Hong and Cheng, "An accurate jitter estimation technique for efficient high speed i/o testing", IEEE Asian Test Symposium, 2007. This technique, however, only provides accurate results when the fit is performed far enough down the tails.

As indicated before, the problem is that the Q-tail asymptotically approaches the straight line behavior, but does not fully reach it. This always ensures pessimistic BER estimation, which is a beneficial property, but can also highly mislead if the fit is not applied in a suited region. In any case, the estimation becomes very difficult if the Gaussian tails are not correctly identified.

The proposed method is based on an optimization procedure, which provides fast search of unknown values of random $RJ_{rms}$ and deterministic jitter $DJ_{pp}$ components.

A detailed description of the method will be given later on together with testing results that evidence the performance of the proposed approach. In the following however, the focus is to give an overview of methods according to embodiments of the present invention.

The application of a method according to an embodiment of the invention may be divided into the following steps:

Collect jitter amplitude data to construct a histogram and determine the cumulative density function (CDF) of the jitter amplitude distribution;

Apply weighted/scaled Q-normalization to linearize the tail parts of the CDF;

Optimize the fit of a regression line to the linearized Gaussian tail behavior of the Q-normalized CDF; and Obtain Gaussian model parameters from fitted regression line parameters and calculate deterministic and random components of the jitter distribution.

The histogram is simply generated by collecting data samples and plotting its probability density function (PDF) in terms of the measured sample amplitude. By integrating the histogram one obtains the CDF, which is already a rough estimate for error probability.

Figure 4C:
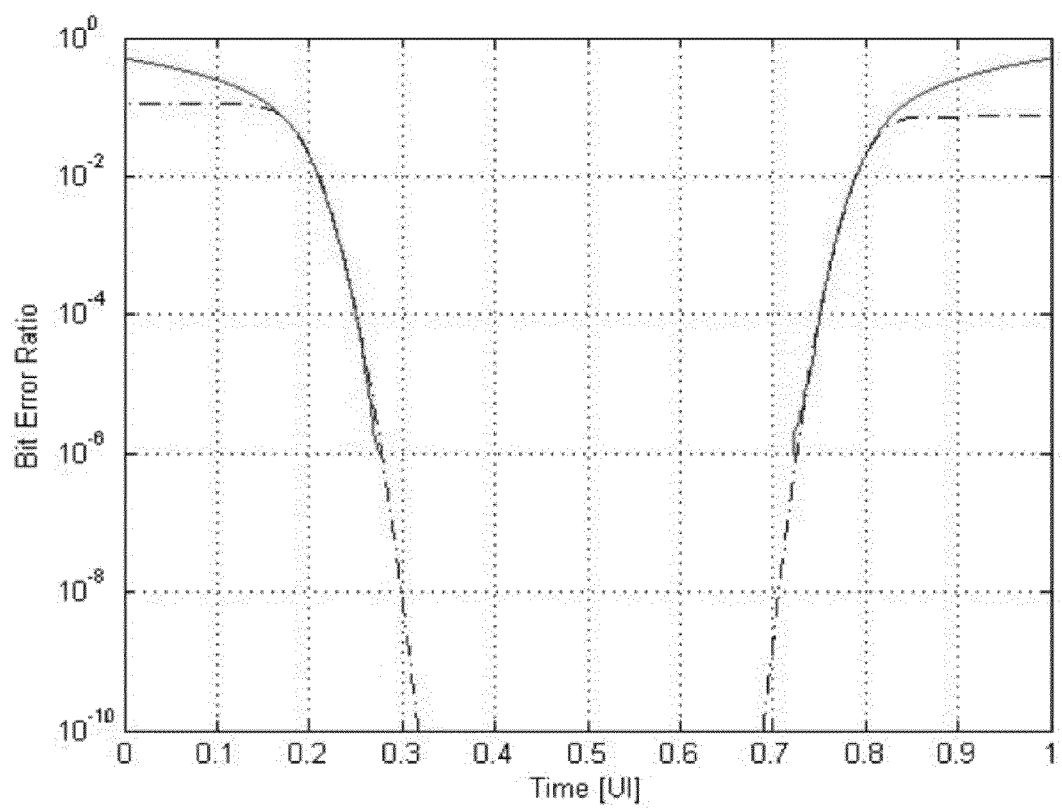
FIG. 4c shows a bathtub curve with fitted Gaussian tail models, extrapolating to the BER level of interest.

When depicting the CDF in a logarithmic scaled diagram, centered around the optimum decision or sampling time instant as shown in FIG. 4c, one yields the already mentioned bathtub curve (shown as solid curves in FIG. 4c). On the basis of a modified bathtub curve, the optimization algorithm proposed in this application is able to conveniently estimate parameters of approximated Gaussian tail parts of the CDF on both sides. In other words, the proposed optimization algorithm enables reconstructing the present tail behavior, for instance the tail behavior of the CDF as shown in FIG. 4c, such that the measured bathtub curves may be extrapolated (e.g., by the dashed curves in FIG. 4c) to the BER level of interest where the remaining eye opening (e.g., corresponding to $L(10^{-12})$ in FIG. 4b at BER=$10^{-12}$) may be evaluated.

The Q-function normalizes a distribution in terms of Gaussian variance, which causes the tails of pure Gaussian distributions to appear as straight lines. However, the tails of the resulting normalized Q-function will only asymptotically approach straight lines, when the tails of a distribution are truly Gaussian. Nevertheless, this property may still be used to recover the desired values of random $RJ_{rms}$ and deterministic jitter $DJ_{pp}$ components.

Figure 5:
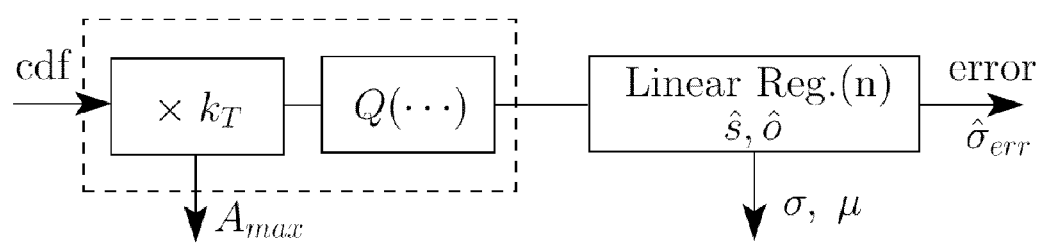
FIG. 5 shows a scheme for the optimization of a linear regression to establish a linear extrapolation of a bathtub curve according to an embodiment of the present invention.

The proposed method is based on the optimization scheme or procedure as shown in FIG. 5.

FIG. 5 symbolizes that the optimized parameter set of the approximated Gaussian distribution may be found in a twofold approach by splitting the optimization into two consecutive stages. The first section scales the CDF of the measured jitter amplitude distribution with a scaling factor $k \geq 1$ and performs the Q-normalization according to the following Q-function:

$$Q(x) = \sqrt{2} \cdot \mathrm{erfc}^{-1}(2 \cdot CDF(x) \cdot k) \quad (10).$$

Figure 6A:
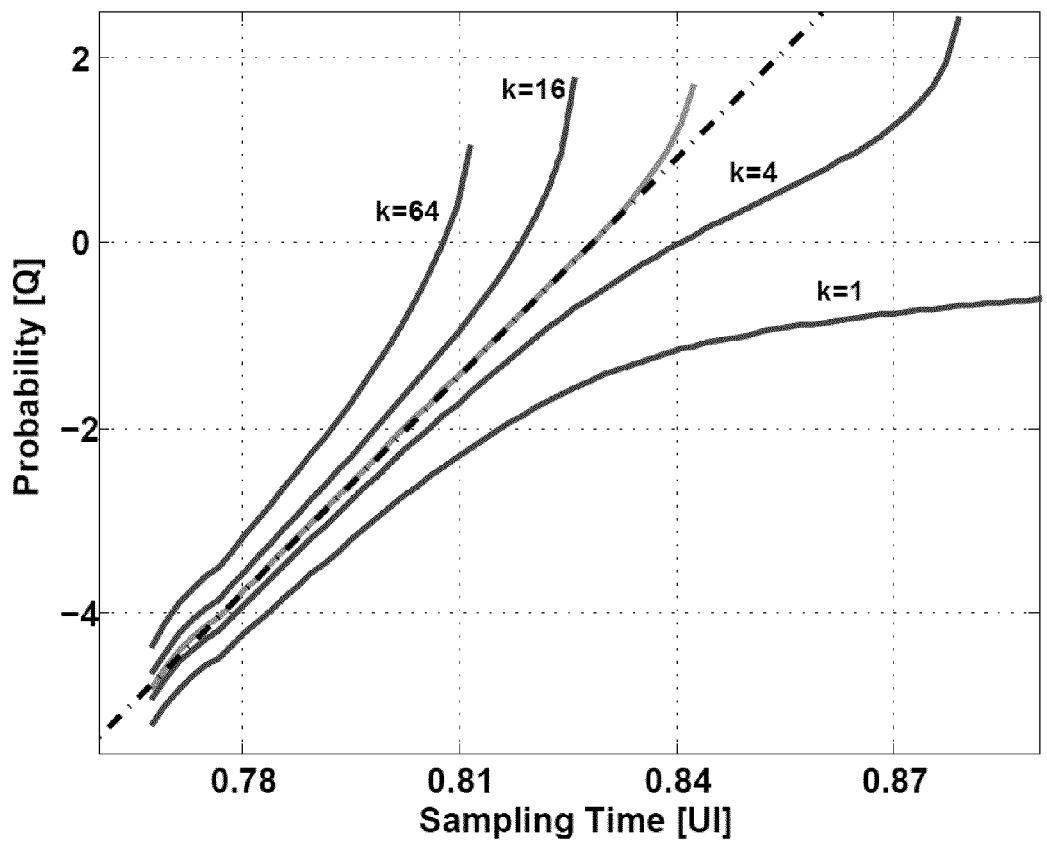
FIG. 6a shows exemplary weighted/scaled Q-functions with scaling factors of k=1, 4, 16, 64 and a maximum linearity obtained at a scaling factor of k=7.15.

The effect on the data of jitter distribution as represented by the CDF is demonstrated in FIG. 6a. It results in bent Q-functions that achieve maximum linearity for a certain scaling factor k. This is the value where the investigated tail parts of the Q-normalized CDF may be best described by a Gaussian distribution. In the example according to FIG. 6a, this is achieved at k=7.15 with the least bent Q-function in the middle of all Q-functions depicted together with an optimized dashed regression line.

In order to quantify the linearity of a tail part of such a Q-function scaled with scaling factor k, the regression error of a fitted regression line may be utilized as a goodness-of-fit measure. This explains the second optimization stage, where a linear regression analysis is used to determine the best suited tail region for fitting the data of the normalized jitter distribution representation.

Accordingly, the second optimization stage returns a fitted slope, offset and regression error of the fitted regression line, with the regression error as a fitness value to be minimized. Over different values of the scaling factor k for the Q-function, one may eventually obtain a global minimum of the regression error.

Furthermore, the regression error of the second optimization stage may be determined as minimum along all possible regression lengths n of the tail parts of the Q-function. By starting with the outermost values of the Q-function, samples may recursively be added and the corresponding regression error may be calculated. The linear regression may offer very simple recursions for that purpose, and hence may efficiently determine the desired regression error minimum, for instance with equations as given below (see Equation 11c).

In order to find a global minimum of the regression error, the second optimization stage may be applied for every value of the scaling factor k. To avoid unnecessary computational load, a logarithmically scaled search grid may be utilized for initial estimates of the scaling factor k. A refined minimization may finally obtain an accurate estimate after a few more iterations.

Once the above described optimization stages have been performed, one may easily derive the model parameters for the approximated Gaussian tails based on the parameters obtained from the regression analysis and the global optimization stages of the regression error over varying scaling factor k and/or regression lengths n using Equations 12:

$$A_{max}=1/k,\ \sigma=1/\hat{s},\ \mu=-\hat{o}/\hat{s} \quad (12)$$

where k is the scaling factor of the Q-function, ŝ is the slope and ô is the estimated offset of the fitted regression line.

The proposed method based on scaling of the Q-normalization may be performed separately for positive and negative (left and right sided) tail samples of the Q-function, which allows for decomposition of the measured distribution into deterministic ($DJ_{pp}$) and random components ($RJ_{rms}$).

The amount of total jitter may be specified by Equation 4 for a given BER level, since the random jitter component is always assumed to be unbounded.

The proposed algorithm achieves very good estimates with better performance than the methods described in the references. Further, results are obtained very efficiently from simple recursions instead of requiring complex optimization procedures.

Embodiments of the invention comprise accurate and efficient methods to determine the extent of probability distributions composed of Gaussian tails, such as jittery data distributions in high-speed serial interfaces. Methods according to embodiments of the invention decompose a given distribution into bounded deterministic and unbounded random components, which allows for jitter influence analysis and derivation of a timing budget, e.g., with the help of Equation 4.

Methods according to embodiments of the invention may be implemented in any device investigating the characteristic of jitter distributions, such as the already mentioned BERT-scope, if the desired BER level does not have to be measured but can be extrapolated from a higher probability level. Here, methods according to embodiments of the invention may offer significant reduction of measurement time and can easily be implemented in a DSP architecture.

Another application may be in production testing, where the I/O margining test as described in may be replaced by a more accurate jitter estimation method according to certain embodiments of the invention without loss of efficiency. See Hong and Cheng, "An accurate jitter estimation technique for efficient high speed i/o testing", IEEE Asian Test Symposium, 2007.

Finally, methods according to embodiments of the invention may allow for in depth qualitative analysis of transceiver systems, which may provide for applications in commercial simulators and analysis devices.

Detailed description of methods according to embodiments of the invention are now described in greater detail.

When starting with the generic Gaussian tail assumption, one basically tries to find the Gaussian model parameters, variance σ, mean μ and amplitude $A_{max}$ which best match the measured tail parts of the distribution such as the CDF of measured jitter amplitudes. From a mathematical perspective, this corresponds to a three dimensional optimization problem.

The Q-normalization is meant to linearize a Gaussian CDF with values in the total range from 0 to 1. In order to search for Gaussian behavior at the tail parts of a distribution, one could consider utilizing adapted versions of the Q-normalization that linearize tail parts of the distribution by expecting a certain Gaussian amplitude $A_{max}$. These adapted Q-functions would only linearize the narrowed range from 0 to $A_{max}$<1.

By adjusting $A_{max}$ as a search parameter, the best matching Gaussian amplitude may then be found with the Q-function yielding maximum linearity of the normalized distribution. This would theoretically require an appropriate Q-normalization stage for each of the adjustable Gaussian amplitudes, which is not feasible.

This problem may be overcome with an inverse approach, i.e., by scaling the input CDF prior to Q-normalization. This increases the probability of tail samples and thus causes the same effect as described before. The linearity of the tail parts of the Q-normalized CDF may then be quantified via linear regression analysis where the regression error may be used as a fitness measure. This allows for the construction of an embodiment of an optimization scheme as depicted in FIG. 5.

The parameter k≧1 may be used to scale the probability of tail samples of the input CDF prior to Q-normalization. The Q-normalization or Q-transform expects a CDF with values in the full range. Thus, by scaling the CDF, the investigated probability region may be narrowed toward the tail parts of the CDF. Therefore, the Q-normalization may now be carried out only on samples of the CDF up to 1/k which is the inverse of the Gaussian tail amplitude $A_{max}=1/k$.

The remaining model parameters of the approximated Gaussian tail parts, namely variance σ and mean μ may be retrieved from the linear regression stage, as will be explained below. As described before, the optimization scheme can also be seen as a twofold approach composed of two consecutive stages as symbolized in FIG. 5. The first stage scales the measured CDF with the scaling factor k and performs the Q-normalization. With CDF(x)=BER(x)/$\sigma_T$, Equation 9 may be rewritten as the already cited Equation 10:

$$Q(x)=\sqrt{2}\cdot erfc^{-1}(2\cdot CDF(x)\cdot k) \quad (10).$$

The effect on the input data of the CDF is demonstrated in FIG. 6a and results in bent Q-functions that achieve maximum linearity for a certain scaling factor k. In the Q-domain, this is the value where the distribution tail may best be described by a Gaussian distribution. In the second optimization stage, at least one regression line may be fit to a tail part of the obtained Q-function. The second optimization stage may return fitted slope ŝ, offset ô and regression error $\hat{\sigma}_{err}$, wherein the regression error may be used as a fitness value for the optimization process.

Figure 7:
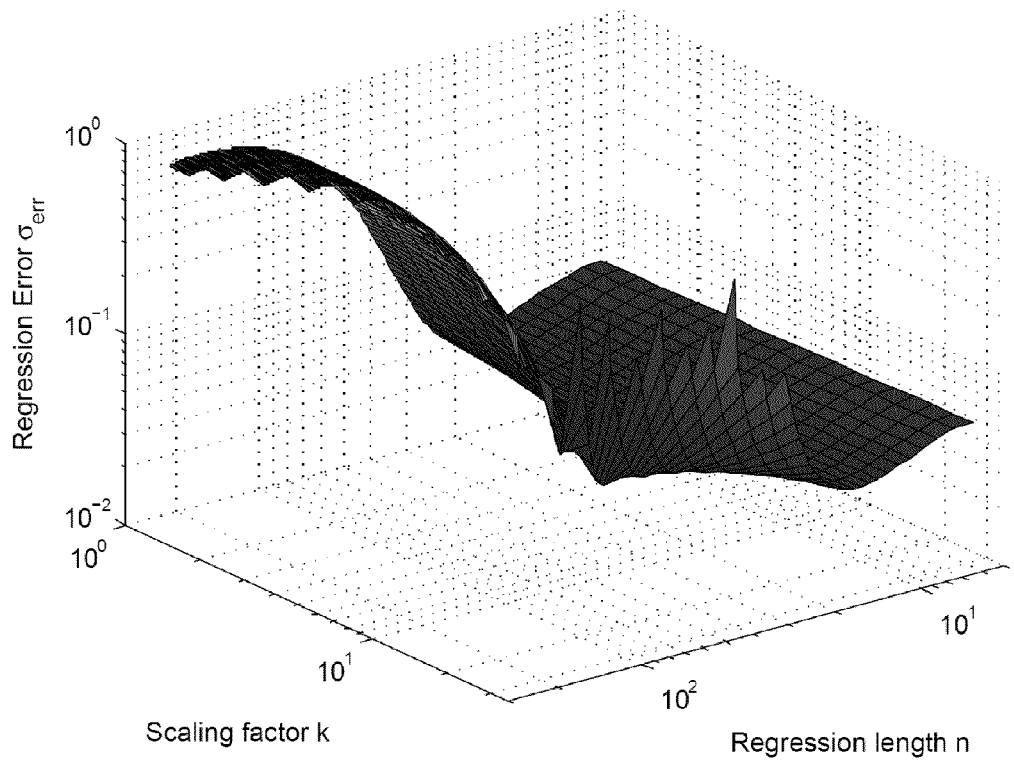
FIG. 7 shows a diagram of the regression error $\hat{\sigma}_{err}$ in dependence of the scaling factor k and the regression length n of the tail part of the Q-function (short Q-tail)
Figure 8:
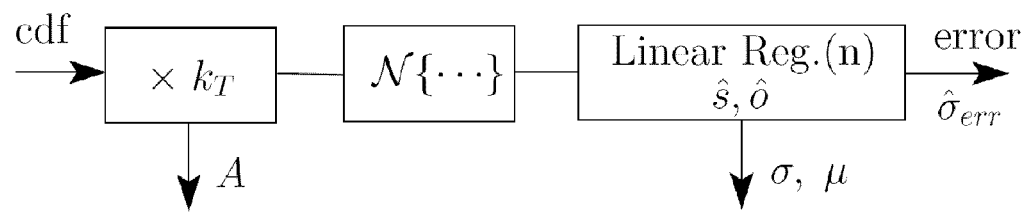
FIG. 8 shows a generalized scheme for the optimization of a linear regression to establish a linear extrapolation of a normalized arbitrary distribution according to an embodiment of the present invention.

FIG. 7 shows the regression error $\hat{\sigma}_{err}$ as a function of scaling factor k and fitted tail length n, demonstrating its potential as a goodness-of-fit measure. The variable n can also be seen as a fraction of the unit interval where the tail fit is performed, given the time resolution or number of time divisions per unit interval.

The global regression error minimum with optimized k and n finally yields the desired Gaussian parameters. The minimum regression error of the second optimization stage is determined along the increasing regression length n of the Q-tail. That is, the search algorithm starts with an initial number of outermost samples and moves toward higher probability level by recursively adding tail samples.

Figure 6B:
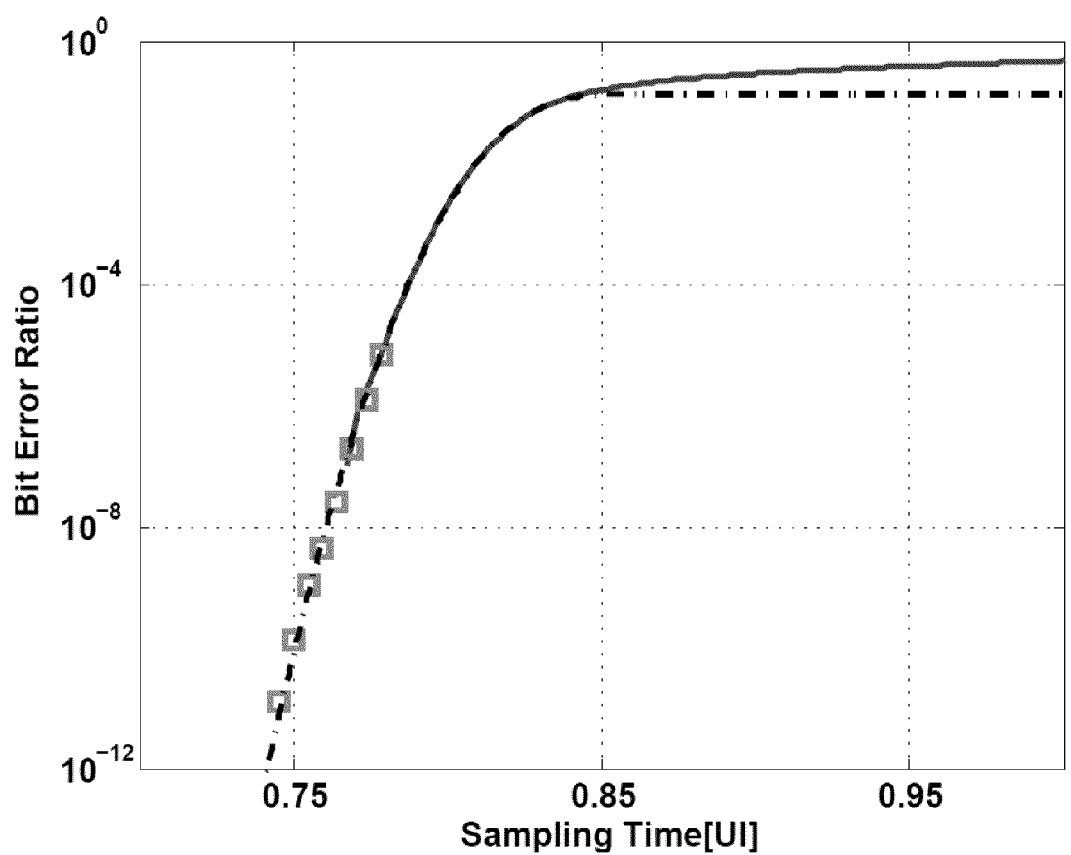
FIG. 6b shows the right part of the bathtub curve with an extrapolation fitted to its approximated Gaussian tail, the fitting based on an optimized linear regression according to an embodiment of the present invention.

FIG. 6b shows an example of a scaled Q-normalization of $10^7$ jitter amplitude samples from a 1 Gb/s signal (measured with Agilent Infiniium 40 GS/s). The jittery data is generated with a SyntheSys BERT-scope ($DJ_{pp}$=0.3, $RJ_{pp}$=0.2), which also provides the bathtub nodes at lowest BER level in FIG. 6b. The required calibration delay is chosen to match the highest point of the BERT-scope with the Agilent bathtub.

FIG. 7 shows the regression error $\hat{\sigma}_{err}$ depending on scaling factor k and regression length n of the regression line used to describe the tail parts of the Q-function. The example is the same as in FIG. 6b with an interpolated time resolution of 1.83 ps (1 UI=1000 ps). Thus, for each additional sample increasing the regression length n, the investigated region of the Q-function becomes larger, and may qualitatively be described by the respective regression error $\hat{\sigma}_{err}(n)$.

The linear regression may offer very simple recursions for that purpose, and hence may be used to efficiently determine the desired error minimum. With given data pairs $(q_i, x_i)$ where $i=\{1, \ldots, n\}$, regression analysis assumes a linear relation $q_i = x_i \cdot \hat{s} + \hat{o}$ for a tail part of the Q-function, and yields:

$$\hat{s} = \frac{n \cdot \sum x_i q_i - \sum x_i \cdot \sum q_i}{n \cdot \sum x_i^2 - (\sum x_i)^2}, \quad (11a)$$

$$\hat{o} = \frac{\sum q_i - \sum x_i \hat{s}}{n}, \quad (11b)$$

$$\hat{\sigma}_{err} = \sqrt{\frac{\sum q_i^2 - \frac{1}{n}(\sum q_i)^2 - \hat{s} \cdot \left(\sum x_i q_i - \frac{1}{n}\sum x_i \cdot \sum q_i\right)}{n-2}}, \quad (11c)$$

where $\hat{s}$ and $\hat{o}$ are the estimation parameters for line slope and offset, and $\hat{\sigma}_{err}$ is the regression error to be minimized.

As n is the variable constantly incremented during optimization, the present summing terms may easily be implemented as recursions. For that purpose, an initial minimum number of data samples should be specified conservatively. Their purpose is to avoid wrong convergences at the beginning of the tail parts of the Q-function due to limited time resolution and random fluctuations at the tail endings. An appropriate data selection avoids outliers and makes the algorithm more robust against noisy distributions.

In order to determine the global minimum of the regression error $\hat{\sigma}_{err}$, the second optimization stage may be applied for every value of the scaling factor k. To avoid high computational load, a logarithmically scaled search grid may be utilized for an initial estimation of the scaling factor k. In a refined minimization of the regression error $\hat{\sigma}_{err}$, an accurate estimate of the scaling factor k may be obtained after a few more iterations. Once the optimization procedure has finished, the Gaussian model used to approximate the tail parts of the Q-function may easily be derived from the above mentioned parameters of the regression lines fitted to the tail parts of the Q-function as:

$$A_{max}=1/k, \; \sigma=1/\hat{s}, \; \mu=-\hat{o}/\hat{s} \quad (12).$$

The scaling factor k scales the input CDF of the jitter amplitude data samples. Thus, the scaling factor k corresponds to the inverse of the amplitude $A_{max}$ of the approximated Gaussian distribution. Hence, the scaling yields a fractional part of collected jitter amplitude samples belonging to the approximated Gaussian tail part. For example, if the measured distribution is a Gaussian folded with a well separating dual-Dirac distribution ($DJ_{pp} \gg RJ_{rms}$), the complete negative half of the data samples will belong to the left sided Gaussian, and hence, the resulting fractional of collected jitter amplitude samples will equal $1/A_{max}=k=2$.

The parameter $\sigma$ in Equation 12 may be obtained as an inverse of the gradient of the linearized tail part of the Q-function. This is due to the inherent property of the Q-function, to normalize a given distribution in units of Gaussian variance. "Jitter analysis: The dual-dirac model, rj/dj, and q-scale", White Paper, Agilent Tech., December 2004. Finally, $\mu$ is the jitter amplitude where the regression line crosses the zero value, decomposing the measured distribution into bounded deterministic jitter DJ and unbounded random jitter RJ components. Thus, with $$q=\mu \cdot \hat{s} + \hat{o} \Rightarrow \mu = -\hat{o}/\hat{s},$$

one obtains the third expression in Equation 12.

The proposed scaled Q-normalization method should be performed separately for both distribution tail parts. For positive (left sided) jitter amplitude samples the distribution 1-CDF may be utilized as input to the optimization process instead of the original distribution CDF. This concept allows for the decomposition of a total jitter distribution into deterministic $DJ_{pp}$ and random $RJ_{rms}$ components according to Equation 13:

$$DJ_{pp}=\mu_L+\mu_R, \; RJ_{rms}=(\sigma_L+\sigma_R)/2 \quad (13).$$

Deterministic $DJ_{pp}$ and random $RJ_{rms}$ components may now be inserted in Equation 4 to finally yield the TJ timing budget.

As will be demonstrated in the following, methods according to embodiments of the present invention achieve very high accuracy, even if only a comparable small amount of samples is provided for the probability distributions. Due to the linearization of Gaussian functions with scaled Q-normalization, the three-dimensional optimization problem ($\mu$, $\sigma$ and $A_{max}$) may be basically simplified to a linear regression analysis with preceding data normalization.

A key advantage may be the efficient application of recursions inside the linear regression stage, making the optimization process very fast. Other approaches, such as the tail fit algorithm based on chi-squared testing have to face the entire non-linear 3D-optimization, and hence such implementations are very complex and suffer from high computational demand. See Hong et al., "Bit-error-rate estimation for high-speed serial links," IEEE Transactions on Circuits and Systems, 53(12):2616-2627, 2006; Li et al., "A new method for jitter decomposition through its distribution tail fitting," IEEE International Test Conference, 1999; and Scott McClure, "Digital jitter measurement and separation," Master's thesis, Texas Tech University, Lubbock, Tex., 2006.

The analysis concept according to embodiments of the present invention may be seen in an even more generic context where the Q-normalization is replaced by a normalization stage that linearizes arbitrary distributions according to an expected distribution shape. In this way, the concept may be reused for every non-Gaussian tail distribution that can be described in terms of the three parameters amplitude A, dispersion u and location $\mu$.

In the following, the performance of the scaled Q-normalization method will be analyzed with respect to the estimation accuracy tested over a variety of generated jitter distributions. A variable amount of N random samples is picked out of the different distribution types. According to the literature, the jitter distributions are constructed by combining Gaussian random jitter RJ and a uniform, triangular, quadratic curve shaped, dual-Dirac or sinusoidal deterministic jitter DJ component. Ou et al., "Jitter models for the design and test of Gbps-speed serial interconnects," IEEE Design and Test of Computers, 2004.

Figure 9A:
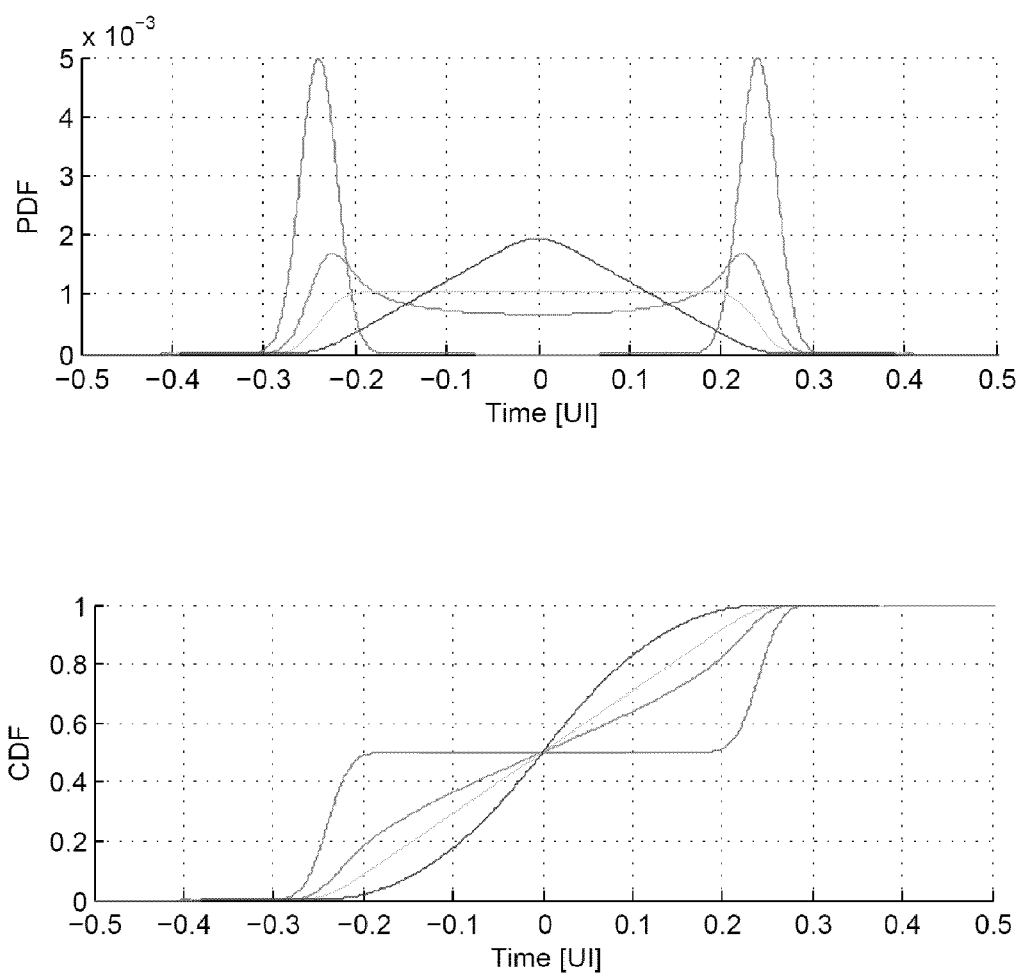
FIG. 9a shows probability density functions (PDF) and cumulative density functions (CDF) of different jitter distribution types for testing the performance of methods according to embodiments of the present invention.

As an example, resulting distributions in terms of their PDF and CDF are given in FIG. 9a. Especially the uniform deterministic jitter DJ component will subsequently be utilized as a reference, as it represents a good compromise between easily decomposable dual-Dirac or sinusoidal distribution curve shapes, and hardly separable triangular or quadratic distribution curve shapes.

Figure 9B:
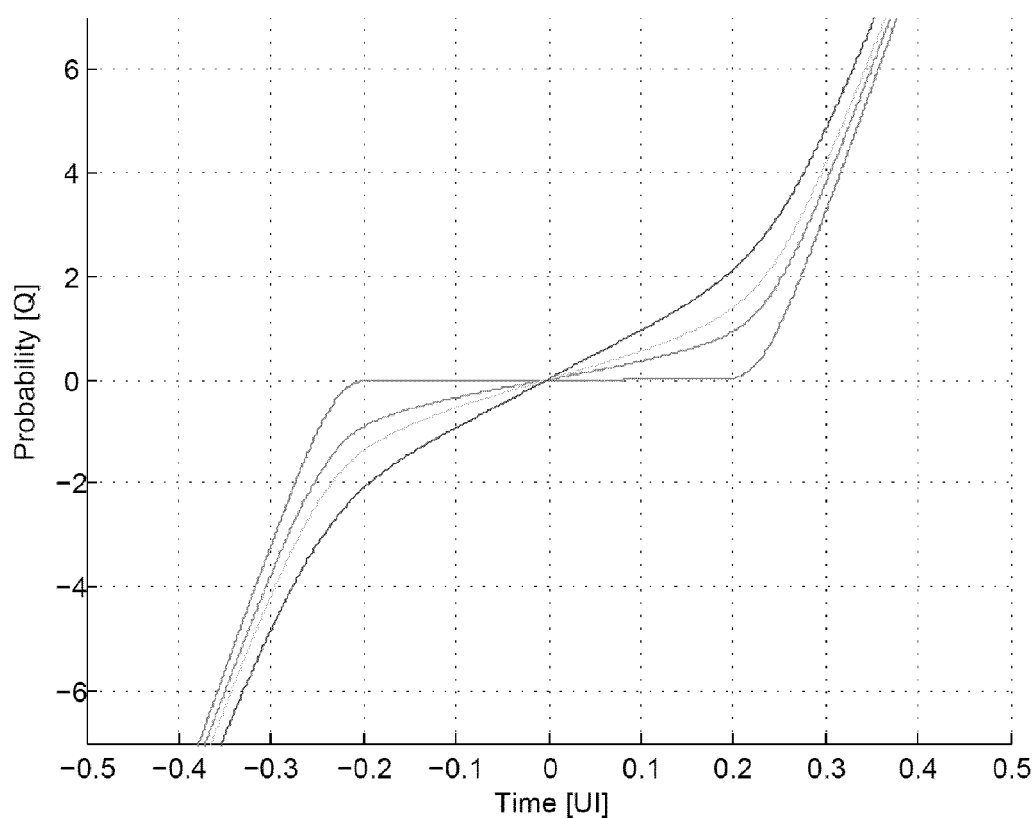

FIG. 9a shows different probability distributions for testing the algorithm performance. FIG. 9b shows Q-normalized functions of the cumulative density functions (CDF) of the different jitter distribution types according to FIG. 9a. In the example, a Gaussian distribution with $\sigma=RJ_{rms}=0.02$ is convolved with a dual-Dirac distribution (characterized by two remarkable edge peaks), a sinusoidal distribution (characterized by two less remarkable edge peaks), a uniform distribution (characterized by a middle flat part) and a triangular distribution with $DJ_{pp}=0.48$ as may be best recognized in the upper part of FIG. 9a showing the respective PDFs of the above-mentioned distributions.

Note, that the distribution synthesis with selected values for random jitter variance $RJ_{rms}$, and deterministic jitter peak-to-peak value $DJ_{pp}$ corresponds to a convolution, and hence estimated $DJ_{pp,est}$ and $RJ_{rms,est}$ values will be different. According to the central limit theorem, the combination of an arbitrary bounded random process with an unbounded Gaussian process will always lead to a distribution that is more Gaussian-like than the prior bounded component. Thus, an increased RJ component ($RJ_{rms,est} \geq RJ_{rms}$) as well as a decreased DJ component ($RJ_{rms,est} \leq RJ_{rms}$) will be observed. This topic has also been investigated in the literature for sinusoidal deterministic jitter DJ type. See e.g., Hong et al., "Bit-error-rate estimation for high-speed serial links," IEEE Transactions on Circuits and Systems, 53(12):2616-2627, 2006.

Throughout the subsequent performance analyses, the specified values for random $RJ_{rms}$ and deterministic $DJ_{pp}$ jitter components will relate to the independent variables prior to convolution, and not to the true values to be found with a given total jitter distribution TJ. The accuracy of estimated total jitter $TJ_{est}$ may be evaluated by investigating the random distribution over multiple evaluation runs.

Due to the statistical spread of data, several hundred evaluations should be collected in order to provide reliable prediction of estimation accuracy. The following statistical information is extracted out of the resulting multiple $TJ_{est}$ estimates and utilized for the below analysis:

Median estimation error, here also referred to as systematic estimation error is expressed in terms of the ratio $TJ_{est}/TJ_{true}$, where $TJ_{true}$ is calculated from numerical approximations of the utilized test distributions.

Upper and lower quartiles define the interquartile range (IQR) as a measure for statistical dispersion.

Figure 10A:
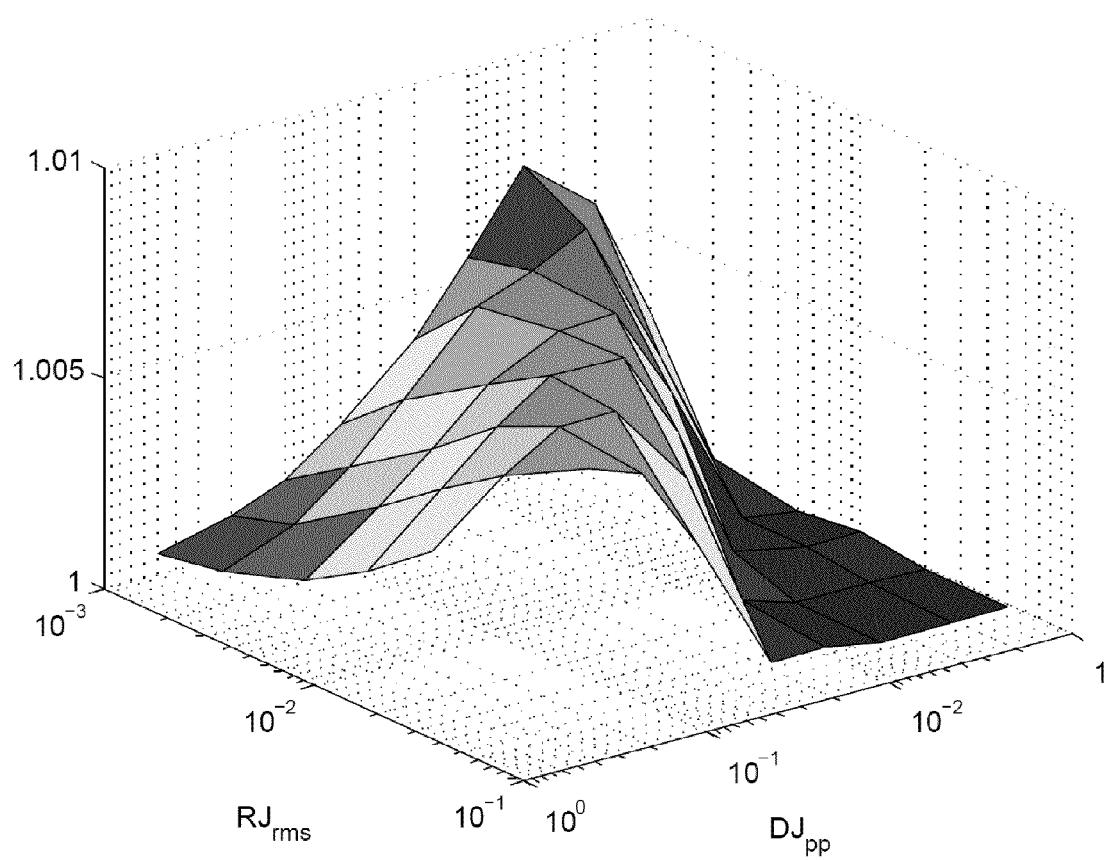
FIG. 10a shows a three-dimensional diagram of the dependence of the median estimation error on random jitter variance $RJ_{rms}$ and deterministic jitter peak-to-peak value $DJ_{pp}$.

The performance analysis begins with combining different values of random jitter RJ variance and uniform deterministic jitter DJ amplitude, and investigates the resulting median estimation error as shown in FIG. 10a. More specific, FIG. 10a shows the influence of $RJ_{rms}$ and $DJ_{pp}$ on median estimation error. The obtained figure is symmetric.

Figure 10B:
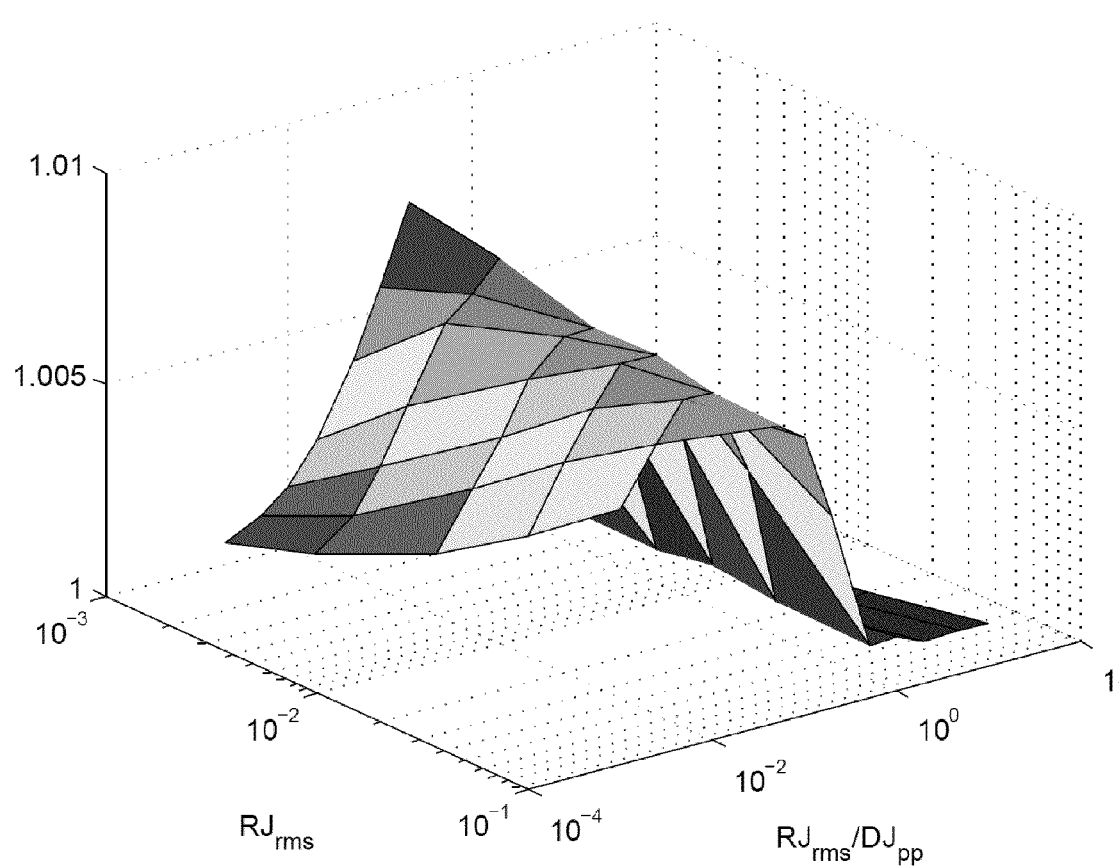
FIG. 10b shows a three-dimensional diagram of the dependence of the median estimation error on the jitter ratio of random jitter variance and deterministic jitter peak-to-peak value $RJ_{rms}/DJ_{pp}$.

By utilizing the jitter ratio of both variables one obtains a rotated view. Using this jitter ratio $RJ_{rms}/DJ_{pp}$ instead of two independent variables $RJ_{rm}$ and $DJ_{pp}$ as shown in FIG. 10b, proves to provide a better suited representation. Namely, as shown by the characteristics of median estimation error in FIG. 10b, the representation may be reduced to a simple two dimensional diagram where the variable $RJ_{rms}$ is discarded, since a dependency of the median estimation error on $RJ_{rms}$ is no longer given. Thus, as long as the estimation is not influenced by the time quantization of the bathtub curve, one may rely on the above explained simplified analysis with jitter ratios.

In the following, the influence of changing the sample size N when collecting a jitter histogram will be investigated first. Then, the analysis is focused on the jitter ratio $RJ_{rms}/DJ_{pp}$ as a variable, and finally, the influence of different deterministic jitter DJ distribution types on the median estimation error is analyzed.

Figure 11A:
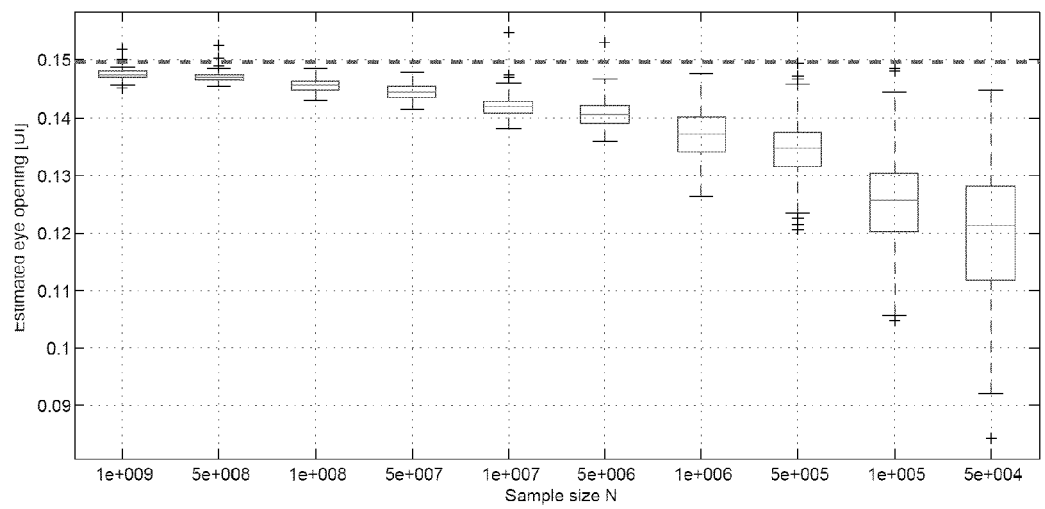
FIG. 11a shows a diagram of the dependence of the spread of one hundred evaluations of the estimated eye opening $t_{eye,est}=1-TJ_{est}$ at $BER_{spec}=10^{-12}$ on sample size N.

Using an optimization method according to an embodiment of the present invention, the performance evaluation starts with the dependence of estimated total jitter $TJ_{est}$ on the number of collected samples N. FIG. 11a shows how one hundred evaluations of $t_{eye,est}=1-TJ_{est}$ are spread at $BER_{spec}=10^{-12}$ over changing sample size N. The analyzed distribution consists of a uniform deterministic jitter component of $DJ_{pp}=0.60$ folded with a random jitter component of $RJ_{rms}=0.02$.

In FIG. 11a, boxes delimit upper and lower quartiles of the evaluation results, while lines within the boxes mark the median value. Moreover, whiskers show the extent of data scattering. Furthermore, outliers are marked with a plus sign and the dashed line finally denotes the true value $t_{eye,true}=0.1497$. FIG. 11a is intended to give a first impression on how the estimated total jitter $TJ_{est}$ should be evaluated in order to provide a qualitative description of estimation performance.

Figure 11B:
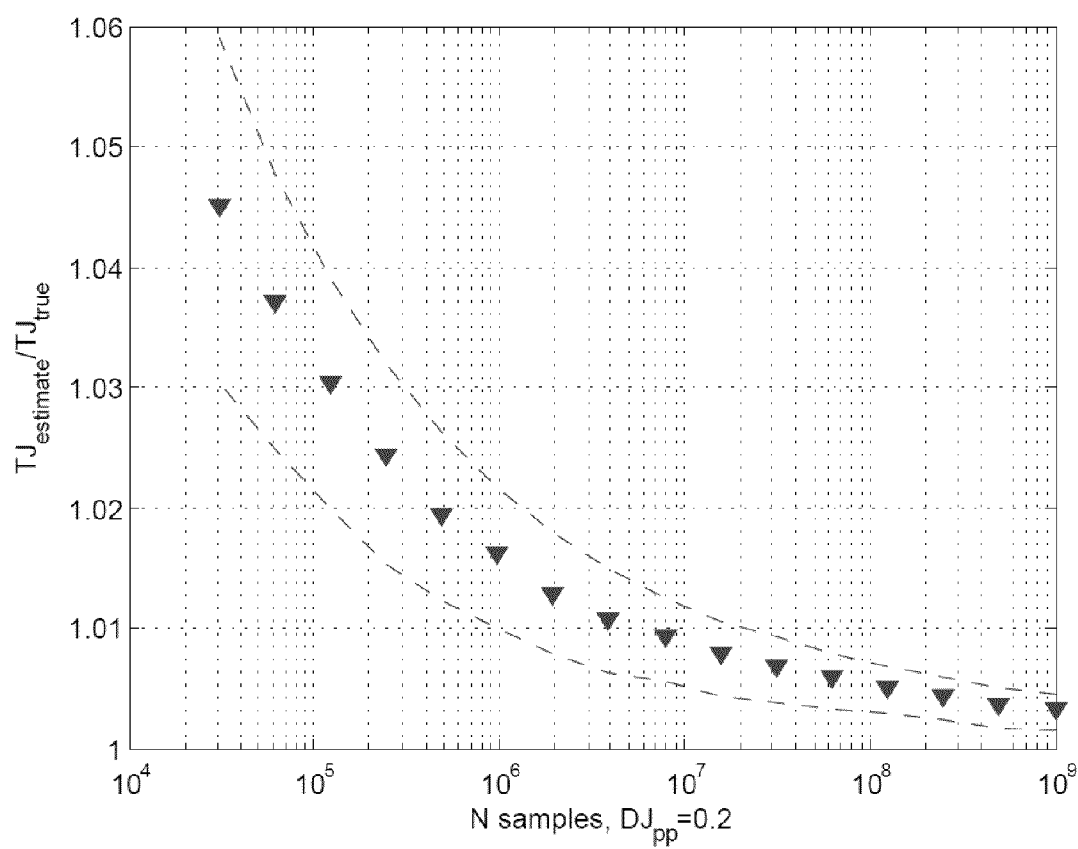
FIG. 11b shows a logarithmic diagram of the dependence of the ratio of estimated total jitter to true total jitter $TJ_{est}/TJ_{true}$ on sample size N at a jitter ratio of $RJ_{rms}DJ_{pp}=1/8$ with dashed curves representing upper and lower quartiles.
Figure 11C:
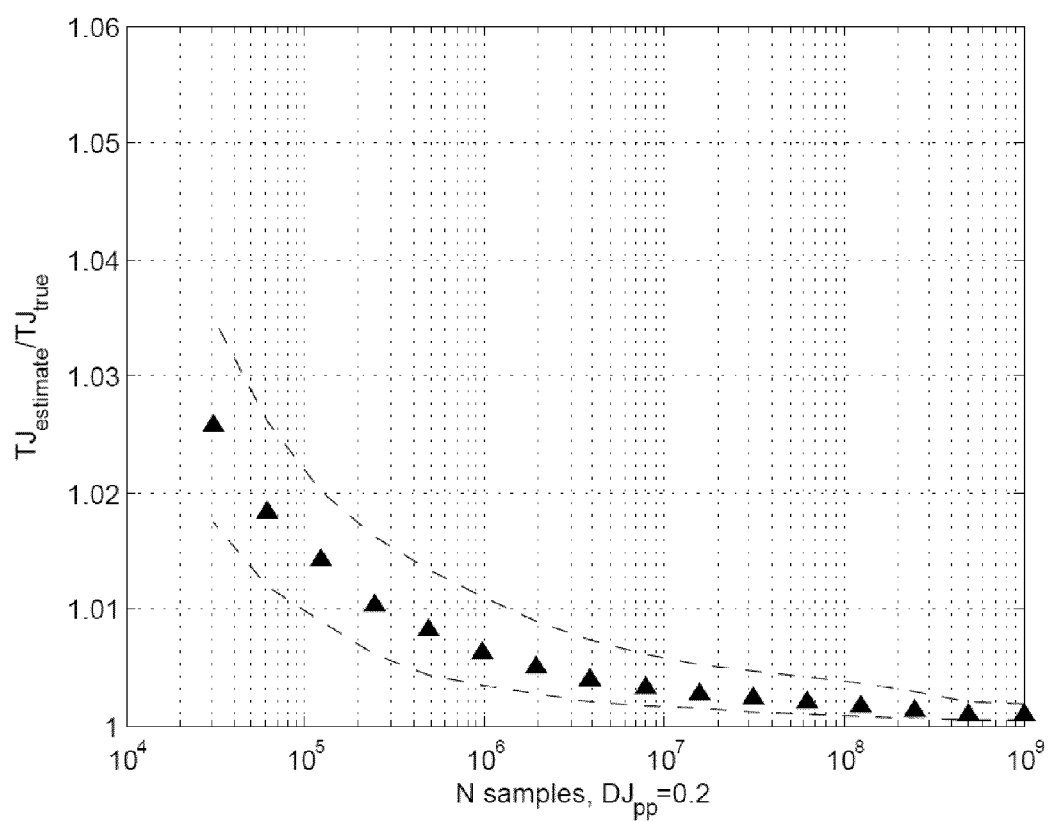
FIG. 11c shows a logarithmic diagram of the dependence of the ratio of estimated total jitter to true total jitter $TJ_{est}/TJ_{true}$ on sample size N at a jitter ratio of $RRJ_{rms}/DJ_{pp}=1/128$ with dashed curves representing upper and lower quartiles.

In FIGS. 11b and 11c the influence of varying sample size N is demonstrated with two different jitter ratios $RJ_{rms}/DJ_{pp}$. The markers represent median values obtained with two hundred realizations, while the dashed lines show upper and lower quartiles determined by random data scattering. The results are represented in terms of the ratio $TJ_{est}/TJ_{true}$. This has the advantage of directly evidencing error percentage. As is to be expected with increasing sample size, both systematic estimation error as well as data spread decrease toward zero, which proves consistency of the estimation approach. However, the jitter ratios $RJ_{rms}/DJ_{pp}$ utilized for generating the test distributions also have significant influence on the resulting estimation error, as will be investigated in the following.

Figure 12A:
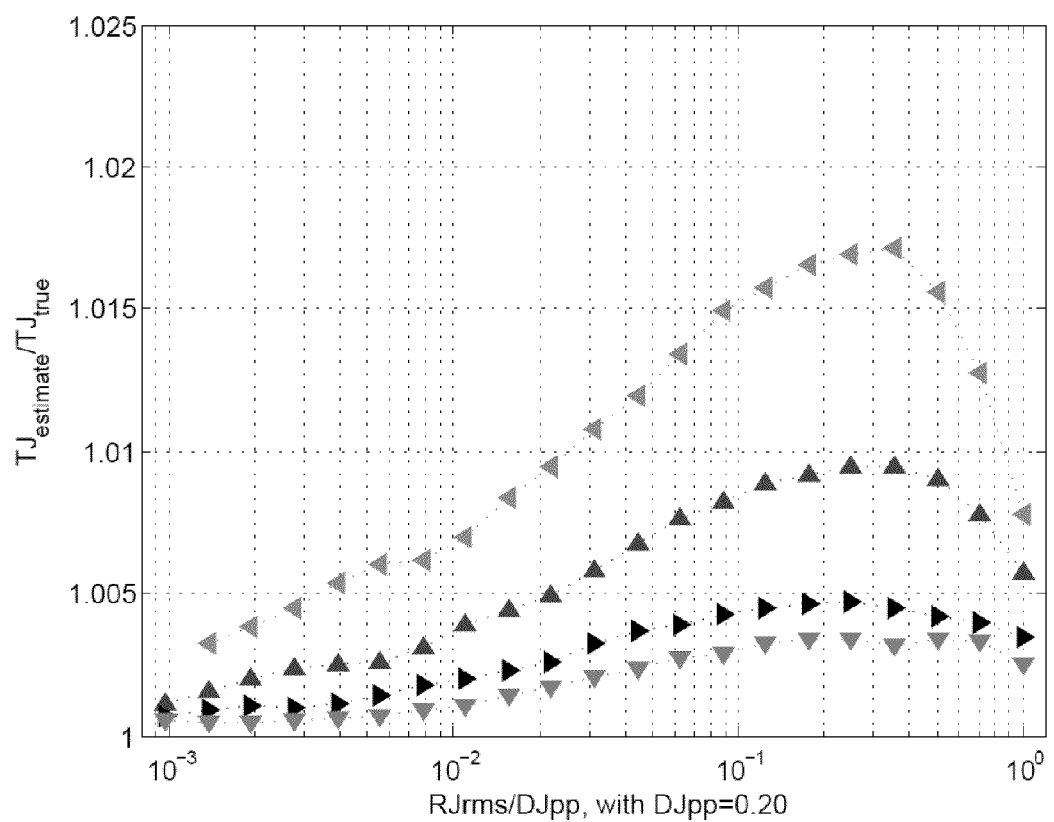
FIG. 12a shows a logarithmic diagram of the dependence of the ratio of estimated total jitter to true total jitter $TJ_{est}/TJ_{true}$ on jitter ratio of $RJ_{rms}/DJ_{pp}$ at varying sample sizes N and $DJ_{pp}=0.20$.
Figure 12B:
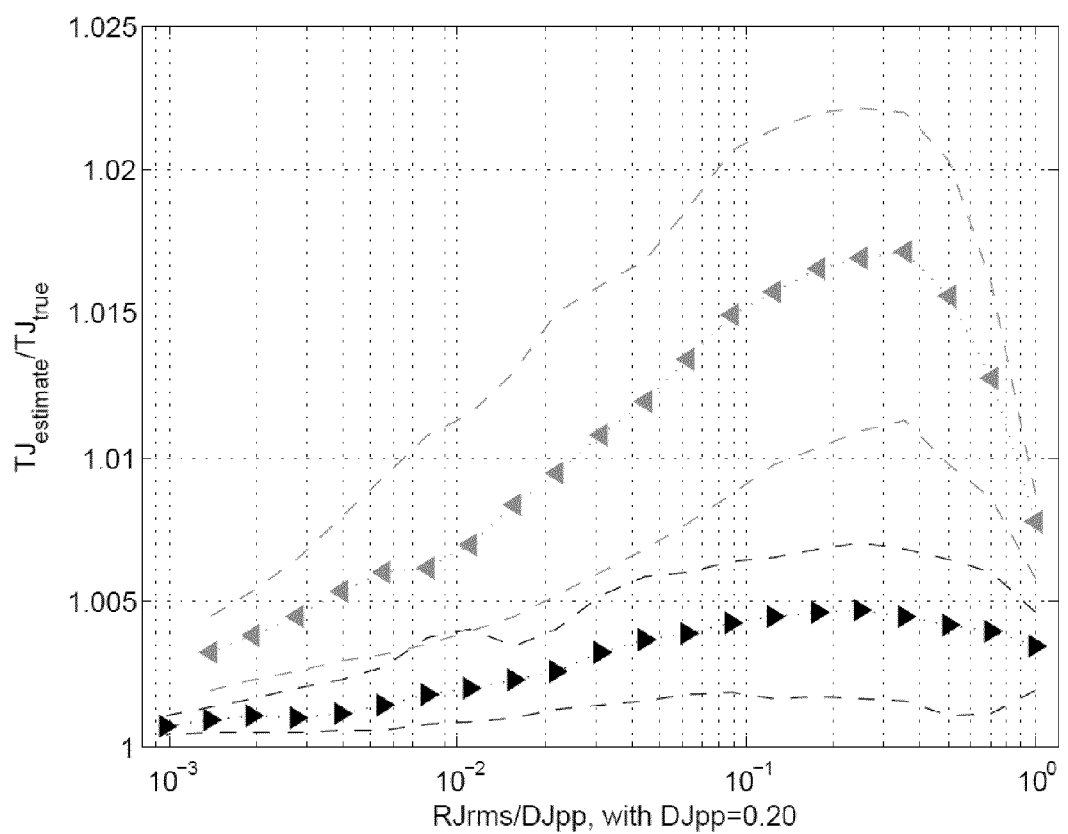
FIG. 12b shows a logarithmic diagram of the dependence of the ratio of estimated total jitter to true total jitter $TJ_{est}/TJ_{true}$ on jitter ratio of $RJ_{rms}/DJ_{pp}$ at varying sample sizes N and $DJ_{pp}=0.20$ with upper and lower quartiles as dashed lines in order to demonstrate the influence of evaluation spread.

FIGS. 12a and 12b investigate the estimation error depending on the jitter ratio $RJ_{rms}/DJ_{pp}$ utilized for the test distributions. Different curves are constructed with $N=\{10^9, 10^8, 10^7, 10^6\}$ jitter amplitude samples and uniform deterministic jitter DJ type. As to be expected, the best result may be obtained with the highest amount of jitter amplitude samples N. In FIG. 12b the same curves for $N=\{10^8, 10^6\}$ jitter amplitude samples are plotted again; this time together with upper and lower quartiles as dashed lines in order to demonstrate the influence of data scattering. Both diagrams evidence an inferior fitting performance for the RJ dominant case. Especially the region around $RJ_{rms}/DJ_{pp} \cong 0.25$ might be utilized later on for worst case analysis.

So far, only the uniform deterministic jitter DJ distribution has been considered for performance evaluation. If the deterministic jitter DJ type is changed to a more Gaussian-like shape such as a triangular or quadratic curve (triangular folded with uniform deterministic jitter DJ distribution), the estimates also degrade since the algorithm detects a single Gaussian-like peak instead of the steep tail parts at the distribution endings. Only a very small percentage of the collected samples belongs to the true Gaussian tail, which makes it very difficult for correct detection. Therefore, the estimation error shows rather high values especially for the quadratic curve shaped deterministic jitter DJ and a small random jitter RJ component. One way to handle this problem is to provide suitable parameters for the linear regression stage.

Figure 13A:
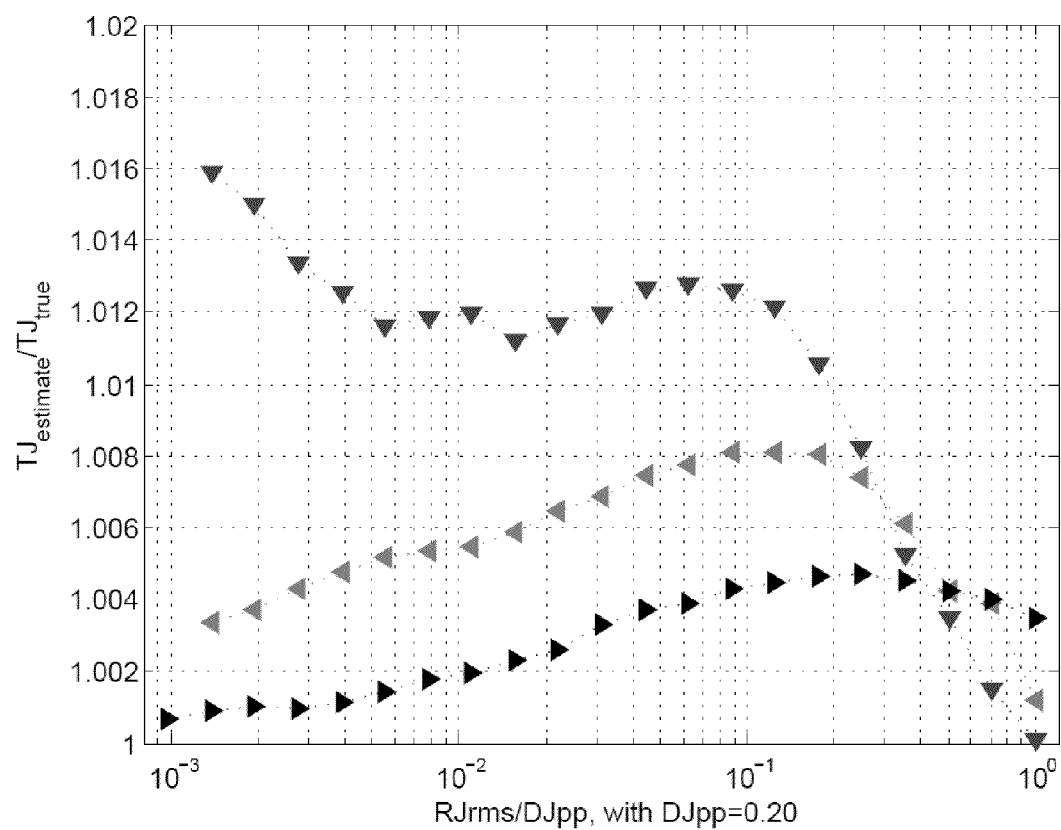
FIG. 13a shows a logarithmic diagram of the dependence of the ratio of estimated total jitter to true total jitter $TJ_{est}/TJ_{true}$ on jitter ratio of $RJ_{rms}/DJ_{pp}$ at varying sample sizes N and $DJ_{pp}=0.20$.
Figure 13B:
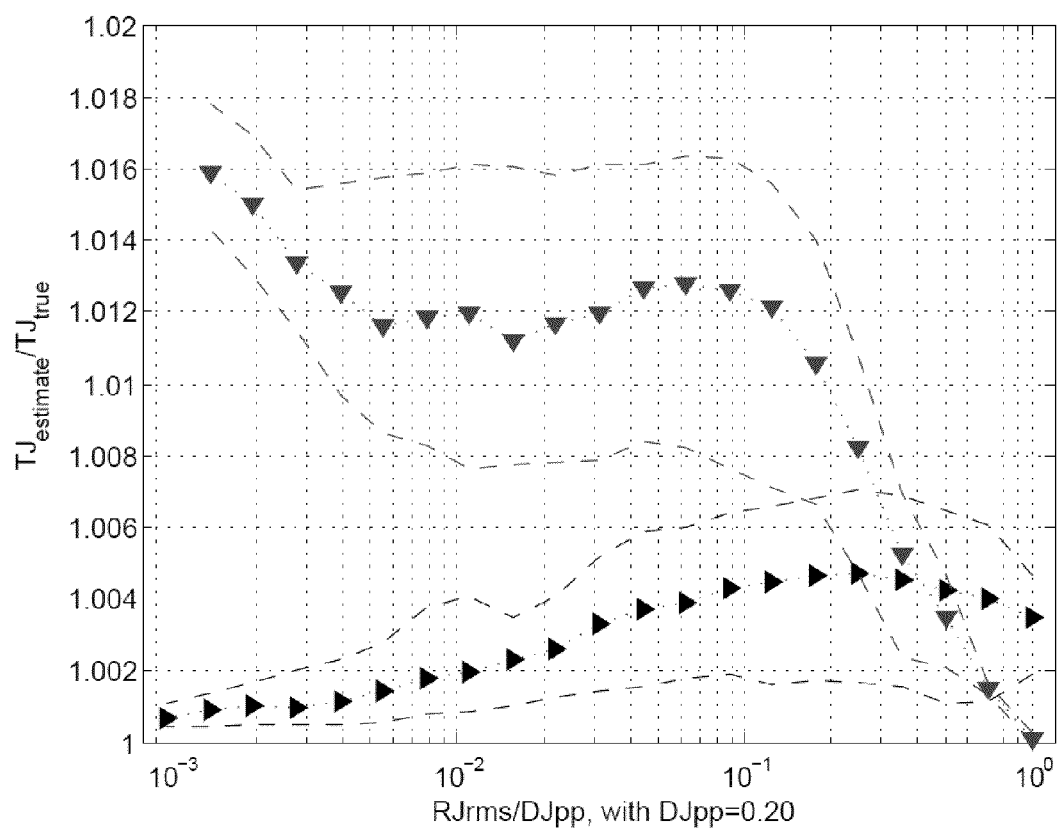
FIG. 13b shows a logarithmic diagram of the dependence of the ratio of estimated total jitter to true total jitter $TJ_{est}/TJ_{true}$ on jitter ratio of $RJ_{rms}/DJ_{pp}$ at varying distribution functions and $DJ_{pp}=0.20$ with upper and lower quartiles as dashed lines in order to demonstrate the influence of evaluation spread.

FIGS. 13a and 13b demonstrate estimation error and evaluation spread with uniform (triangle pointing right), triangular (triangle pointing left) and quadratic curve (triangle pointing down) deterministic jitter DJ. Estimation performance of dual-Dirac and sinusoidal deterministic jitter DJ are not investigated here as their tail parts already follow a fairly Gaussian distribution which may easily be detected by the fitting algorithm and thus, typically obtain better estimates than a uniform deterministic jitter DJ type.

At this point, the preceding performance analyses are summarized and an overview of the major causes for performance degradation are given.

A rather limited amount of samples N is used to represent the probability distribution (FIGS. 11*b/c*).

The random jitter RJ variance is dominant in comparison to the deterministic jitter DJ component (FIGS. 12*a/b*).

The deterministic jitter DJ type is very Gaussian-like but bounded (FIGS. 13*a/b*).

The latter two cases lead to probability distributions where only a small percentage of the collected samples belongs to the Gaussian tail part. One way to overcome this problem is to increase sample size in order to prolongate the Gaussian part of the tail. However, as tail samples become very rare with higher jitter amplitude, acquisition time for the samples also increases exponentially. The estimated total jitter $TJ_{est}$ is always obtained as a pessimistic estimate. This beneficial property may be maintained from the Q-normalization which leads to tail parts asymptotically approaching a straight line behavior.

In limited cases, the optimization procedure may converge toward a wrong scaling factor k, which leads to the consideration of misleading outliers. This problem may be overcome by appropriate parameter selection. The proposed algorithm may, e.g., be implemented in a C/C++ environment where its computational performance mainly depends on the Q-normalization, which may utilize the inverse complementary error function $erfc^{-1}(x)$.

In simulators, an arbitrary time resolution may be selected within a unit interval UI. For instance, in case of a high-speed serial link, a 3 Gb/s signal and a resolution of 1 fs may be chosen, where the unit interval may comprise $L=3.33 \cdot 10^5$ time steps.

With a bathtub curve covering a third of the UI, and thus comprising a hundred thousand samples, optimization of both tail parts may typically take 2-3 seconds on a 2.2 GHz Intel Core2 Duo laptop computer. This is negligible for system behavioral simulations where usually minutes or hours are spent to collect a sufficient amount of data samples. In production testing, this would be too time consuming, but here the bathtub curve is typically generated with phase interpolators, dividing the unity interval into larger sized steps. In case a UI typically comprises only 64 steps when resolved with a 6 bit phase interpolator (instead of $3.33 \cdot 10^5$ in simulation), the optimization may also be more than three orders of magnitude faster compared to the simulation.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for predicting a bit error rate (BER) from a jitter distribution, the method comprising:
applying a Q-normalization scaled with a scaling factor k to the jitter distribution to linearize tail parts of a normalized jitter distribution to approximate Gaussian tail parts;
determining the BER based on the approximated Gaussian tail parts of the normalized jitter distribution; and
wherein the jitter distribution is represented by a cumulative density function (CDF) and the Q-normalization scaled with the scaling factor k follows:
a Q-function $$Q(x) = \sqrt{2} \cdot erfc^{-1}(2 \cdot CDF(x) \cdot k).$$

2. The method of claim 1, further comprising optimizing a fit of at least one regression line to at least one of the approximated Gaussian tail parts of the normalized jitter distribution.

3. The method of claim 2, further comprising:
obtaining model parameters of at least one of the approximated Gaussian tail parts of the normalized jitter distribution from parameters of at least one regression line; and
calculating deterministic and random components of the jitter distribution using the model parameters of the at least one of the approximated Gaussian tail parts of the normalized jitter distribution.

4. A method for extracting deterministic and random components from a distribution, the method comprising:
normalizing the distribution using a normalization function scaled with a scaling factor k to transform tail parts of the distribution to straight lines approximating tail parts of a Gaussian distribution (Gaussian tail parts);
calculating the deterministic and random components of the distribution using model parameters of the approximated Gaussian tail parts;
fitting a regression line to each of the transformed tail parts of the distribution;
utilizing a regression error $\hat{\sigma}_{err}$ of the fitted regression lines as a goodness-of-fit measure; and
minimizing the regression error $\hat{\sigma}_{err}$ over varying scaling factors k.

5. The method of claim 4, further comprising:
additionally minimizing the regression error $\hat{\sigma}_{err}$ over varying regression lengths n.

6. The method of claim 5, further comprising:
enhancing the minimization of the regression error $\hat{\sigma}_{err}$ over varying regression lengths n by recursively determining the regression error as:

$$\hat{\sigma}_{err}(n) = \sqrt{\frac{\sum_{i=1}^{n} q_i^2 - \frac{1}{n}\left(\sum_{i=1}^{n} q_i\right)^2 - \hat{s} \cdot \left(\sum_{i=1}^{n} x_i q_i - \frac{1}{n}\sum_{i=1}^{n} x_i \cdot \sum_{i=1}^{n} q_i\right)}{n-2}}$$

starting with an outermost value $q_1$ of the normalization function, recursively adding values $q_2, q_3, \ldots, q_i, \ldots q_n$ and calculating a corresponding regression error $\hat{\sigma}_{err}(n)$.

7. A device for predicting a bit error rate (BER) of interest from a measured jitter distribution, the device comprising:
a Q-normalization unit adapted to scalably normalize the measured jitter distribution with a scaling factor k to approximate linearized tail parts of the normalized measured jitter distribution;
a prediction unit to determine the BER of interest based on the linearized tail parts;
an extrapolation unit adapted to extrapolate the linearized tail parts of the normalized measured jitter distribution to the bit error rate of interest from a higher bit error rate; and
a minimization unit adapted to minimize a regression error $\hat{\sigma}_{err}$ of at least one regression line fitted to at least one of the linearized tail parts of the normalized measured jitter distribution over varying scaling factors.

8. The device of claim 7, further comprising a calculation unit adapted to calculate deterministic and random components of the measured jitter distribution using model parameters of Gaussian tail parts approximated by the linearized tail parts.

9. A device for extracting deterministic jitter (DJ) and random jitter (RJ) components from a jitter distribution, the device adapted to:
  normalize the jitter distribution in a form of a cumulative density function (CDF) using a Q-function scaled with a scaling factor k to transform tail parts of the jitter distribution to straight lines approximating Gaussian tail parts;
  calculate the deterministic jitter (DJ) and random jitter (RJ) components of the jitter distribution using model parameters of the approximated Gaussian tail parts; and
  wherein the Q-function follows:

$Q(x) = \sqrt{2} \cdot \text{erfc}^{-1}(2 \cdot \text{CDF}(x) \cdot k)$.

10. The device of claim 9, further adapted to optimize a fit of at least one regression line to at least one of the approximated Gaussian tail parts of the normalized jitter distribution in terms of regression error $\hat{\sigma}^{err}$ of the at least one regression line over varying fitted slope $\hat{s}$ and/or offset $\hat{o}$ of the at least one regression line.

11. The device of claim 10, further adapted to minimize the regression error $\hat{\sigma}_{err}$ over varying scaling factors k.

12. The device of claim 11, further adapted to additionally minimize the regression error $\hat{\sigma}_{err}$ over varying regression lengths n.

13. The device of claim 12, further adapted to enhance the minimization of the regression error $\hat{\sigma}_{err}$ over varying regression lengths n by recursively determining the regression error as:

$$\hat{\sigma}_{err}(n) = \sqrt{\frac{\sum_{i=1}^{n} q_i^2 - \frac{1}{n}\left(\sum_{i=1}^{n} q_i\right)^2 - \hat{s} \cdot \left(\sum_{i=1}^{n} x_i q_i - \frac{1}{n} \sum_{i=1}^{n} x_i \cdot \sum_{i=1}^{n} q_i\right)}{n-2}}$$

starting with an outermost value $q_1$ of a normalization function, recursively adding values $q_2, q_3, \ldots, q_i, \ldots q_n$ and calculating a corresponding regression error $\hat{\sigma}_{err}(n)$.

14. The device of claim 10, further adapted to obtain model parameters $\sigma$ and $\mu$ corresponding to the approximated Gaussian tail parts of the normalized jitter distribution from parameters slope $\hat{s}$ and offset $\hat{o}$ of regression lines fitted to a left one and a right one of the approximated Gaussian tail parts as $\sigma_L = 1/\hat{s}_L$, $\mu_L = -\hat{o}_L/\hat{s}_L$ and $\sigma_R = 1/\hat{s}_R$, $\mu_R = \hat{o}_R/\hat{s}_R$ respectively.

15. The device of claim 14, further adapted to calculate the deterministic (DJ) and random (RJ) components of the jitter distribution using model parameters $\sigma_L, \mu_L$ and $\sigma_R, \mu_R$ corresponding to the left and right one of the approximated Gaussian tail parts of the normalized jitter distribution as $DJ_{pp} = \mu_L + \mu_R$, $RJ_{rms} = (\sigma_L + \sigma_R)/2$.

16. The device of claim 15, further adapted to calculate a timing budget for total jitter (TJ) using the deterministic (DJ) and random (RJ) components of the jitter distribution as $TJ_{pp} = DJ_{pp} + RJ_{pp} = DJ_{pp} + 14.069$

* * * * *

UNITED STATES PATENT AND TRADEMARK OFFICE
CERTIFICATE OF CORRECTION

PATENT NO. : 8,379,754 B2  Page 1 of 1
APPLICATION NO. : 12/415449
DATED : February 19, 2013
INVENTOR(S) : Erb It is certified that error appears in the above-identified patent and that said Letters Patent is hereby corrected as shown below:

In the Claim

Col. 20, line 25, claim 16, delete "$TJ_{pp} = DJ_{pp} + RJ_{pp} = DJ_{pp} + 14.069$" and insert -- $TJ_{pp} = DJ_{pp} + RJ_{pp} = DJ_{pp} + 14.069 \cdot RJ_{rms}.$ --.

Signed and Sealed this
Twenty-ninth Day of April, 2014

Michelle K. Lee
*Deputy Director of the United States Patent and Trademark Office*